United States Patent [19]

Roenker et al.

[11] Patent Number: 5,509,105

[45] Date of Patent: *Apr. 16, 1996

[54] ELECTRONIC NEURON APPARATUS

[75] Inventors: Kenneth P. Roenker, Lakeside Park, Ky.; Chungkun Song, Pusan, Rep. of Korea

[73] Assignee: University of Cincinnati, Cincinnati, Ohio

[ * ] Notice: The term of this patent shall not extend beyond the expiration date of Pat. No. 5,302,838.

[21] Appl. No.: 226,661

[22] Filed: Apr. 8, 1994

Related U.S. Application Data

[62] Division of Ser. No. 896,144, Jun. 9, 1992, Pat. No. 5,302,838.

[51] Int. Cl.$^6$ .......................... H01L 29/161; G06F 15/18
[52] U.S. Cl. ................................. 395/24; 395/25; 257/14; 257/21; 257/23; 257/184
[58] Field of Search .......................... 395/24, 25; 257/14, 257/21, 23, 184

[56] References Cited

U.S. PATENT DOCUMENTS

| | | |
|---|---|---|
| 4,167,791 | 9/1979 | Banavar et al. |
| 4,450,463 | 5/1984 | Chin . |
| 4,602,352 | 7/1986 | Coon et al. |
| 4,603,401 | 7/1986 | Coon . |
| 4,679,061 | 7/1987 | Capasso et al. |
| 4,760,430 | 7/1988 | Coon et al. |
| 4,873,555 | 10/1989 | Coon et al. |
| 5,030,831 | 7/1991 | Coon et al. |
| 5,121,181 | 6/1992 | Smith et al. |
| 5,130,762 | 7/1992 | Kulick . |
| 5,144,397 | 9/1992 | Tokuda et al. |
| 5,148,267 | 9/1992 | Ty Tan et al. |
| 5,198,682 | 3/1993 | Wu et al. |

OTHER PUBLICATIONS

Physics of Semicond. Devices, 2nd Ed., *Thyristors* pp. 190–193, etc. 1981.
Motorola Application Note AN–849, 1982, "Guide to Thyristor Applications".
Motorola Engineering Bulletin EB–106, 1983.
Impact Ionization Across the Conduction Band Discontinuity of Quantum–well Heterostructures, S. L. Chuang & K. Hess, *Journal of Applied Physics*, vol. 59, (1986).
New Avalanche Multiplication Phenomenon in Quantum Well Superlattices: Evidence of Impact . . . Discontinuity, Capasso et al. *Appl. Phys. Lett.*, vol. 48, (1986).

(List continued on next page.)

*Primary Examiner*—David K. Moore
*Assistant Examiner*—A. Katbab
*Attorney, Agent, or Firm*—Frost & Jacobs

[57] ABSTRACT

A multi-well diode is disclosed which can be used with other electronic components as an electronic neuron circuit. The multi-well diode has an S-shaped current-voltage characteristic curve at forward bias whereby it remains in a low conductance state until its threshold voltage is exceeded, then switches through an unstable region of its characteristic curve into a high conductance state. The multi-well diode remains in the high conductance state until its bias voltage and current drops below its holding condition, at which time it switches into a low conductance state. The multi-well diode can be used in a pulse-mode input circuit, thereby generating a pulse-mode output signal which can have a different amplitude and frequency than the input signal. Such pulse-mode input circuits can be either excitatory or inhibitory in operation. The multi-well diode can also be used in a direct current input circuit, having a pulse-mode output signal having a frequency which is related to the input signal's voltage or current. Such circuits emulate biological neurons in electrical characteristics. Such circuits also can have multiple inputs and outputs, and those inputs and outputs can be individually weighted (which is also similar to the operation of biological neurons). The electronic neuron circuits can alternatively be used with optical input or output signals rather than electrical input/output signals. Such circuits can be integrated into neural systems.

25 Claims, 8 Drawing Sheets

OTHER PUBLICATIONS

Theory of S–type Current–Voltage Characteristics of Multi-Layer Isotypic n+–n Heterostructures, Merzin et al. *Sov. Phys. Semicond.*, vol. 20, (Jul., 1986).

Transverse Transport in Multilayer Heterostructures under Carrier Heating Conditions V. I. Tolstikhin, *Sov. Phys. Semicond.*, vol. 20, p. 1375 (Dec. 1986).

Semiconductor Electronic Concepts for Neural Network Emulation, D. D. Coon & A. G. U. Perera, *Inter. J. Electronics*, vol. 63, p. 61, (1987).

Tunneling–Assisted Impact Ionization for a Superlattice, S. L. Chuang & K. Hess, *J. Appl. Phys.*, vol. 61, p. 1510 (1987).

Mechanism of an S–shaped Current–Voltage Characteristic in a Multilayer Isotypic GaAs–AlGaAs Heterostructure, Alferov et al. *Sov. Phys. Semicond.*, vol. 21, (Mar. 1987).

Neuron–like Transient Phenomena in silicon P–I–N Structures, D. D. Coon and A. G. U. Perera, *Solid State Electronics*, vol. 31, p. 851, (1988).

New Hardware for Massive Neural Networks, Coon et al., *Neural Information Processing Systems*, ed., Anderson, Amer. Instit. Physics, NY, NY (1988).

Integrate–and–Fire Coding and Hodgkin–Huxley Circuits Employing Silicon Diodes D. D. Coon and A. G. U. Perera, *Neural Networks*, vol. 2, p. 143 (1989).

Design of an GaAs/AlGaAs Multi–Quantum Well Structure for Use in Neural–like Pulse Mode Circuits, Song et al. *Bulletin of the American Physical Society*, vol. 36 (1991).

The Superlattice Photodetector: A New Avalanche Photodiode with a Large Ionization Rates Ratio, Capasso et al., *Int'l Electron Devices Meeting*, pp. 284–287 (Dec. 1981).

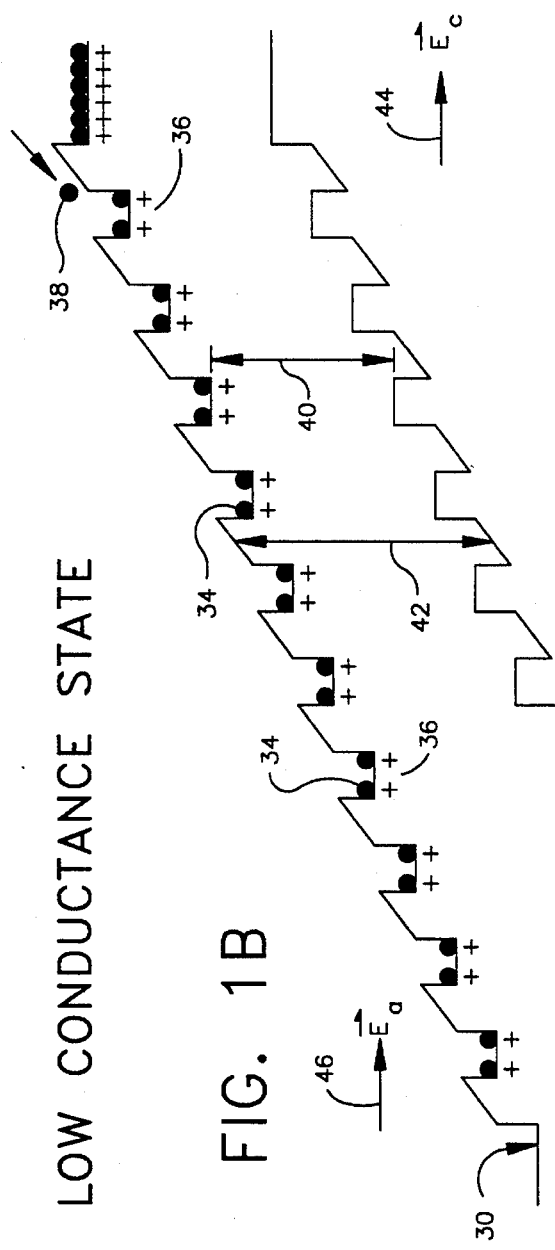
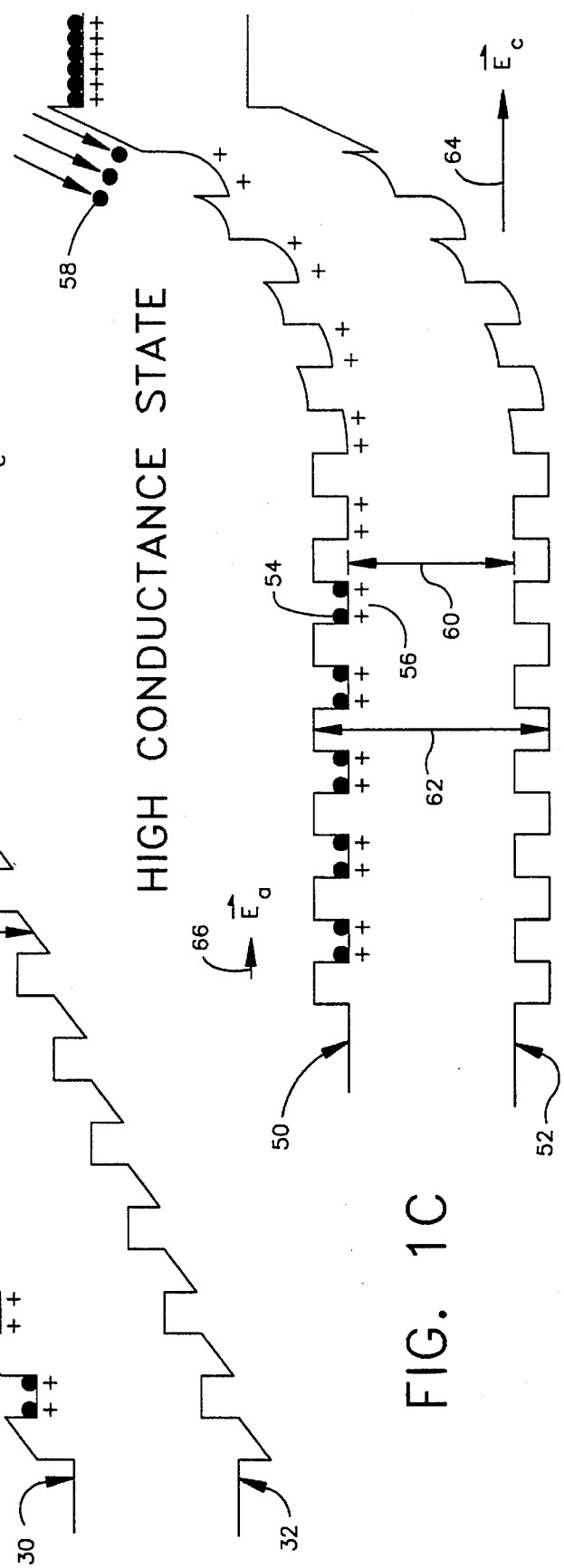
FIG. 1B  LOW CONDUCTANCE STATE
FIG. 1C  HIGH CONDUCTANCE STATE

ELECTRONIC NEURON APPARATUS

This is a divisional of application Ser. No. 07/896,144, filed Jun. 9, 1992, now U.S. Pat. No. 5,502,838.

TECHNICAL FIELD

The present invention relates generally to artificial neural systems and is particularly directed to electronic neuron circuits of the type which can emulate the electrical characteristics of biological neurons. The invention will be specifically disclosed as a multi-well diode that operates at room temperature and, in conjunction with a few electronic components, can operate in the same manner as a biological neuron having either a pulse-mode input or a D.C. input, and having a pulse-mode output.

BACKGROUND OF THE INVENTION

The architectural organization and signal processing functions of the human brain and nervous system are distinctly different and offer particular advantages over conventional, von Neumann digital electronic (computer) systems for a number of important applications, such as pattern recognition for speech and image analysis, and content addressable memory. The computational capabilities of these biological neural systems arise from the collective interaction of many neurons (signal processing elements) which are massively interconnected in a complex network. While the characteristic time associated with individual neuron operation is of the order of a millisecond, neural systems can outperform digital systems for certain applications, even though the characteristic operation time for current digital computer elements is of the order of nanoseconds. Current research in developing artificial neural systems is primarily directed along two lines: (1) simulating in software running on conventional digital computers the signal processing algorithms employed in neural systems, and (2) the development of custom hardware to implement the neural systems approach to signal processing. The first approach suffers from the problem of simulating the largely parallel, asynchronous operation of neural systems on a serial, synchronous computer. The second suffers from inefficiency in replicating the operation of the neuron and its interconnections.

While biological neural systems use a pulse-mode form of signal transmission, wherein information is communicated by varying the frequency of pulses, most approaches to neural hardware implementation utilize conventional digital circuit architecture (digital approach), wherein the information is transmitted and processed in binary form, or use conventional analog circuits (analog approach) such as operational amplifiers where the information is processed as an analog voltage or current. In a few instances the neuron's pulse-mode operation has been replicated, but only with relatively complicated circuits. However, in virtually all of these implementations, conventional transistor-based circuits have been employed so that the electronic equivalent of an individual neuron is a rather complex, multi-transistor circuit. This fact poses significant barriers to the development of complex neural systems employing large numbers (thousands to millions) of electronic neurons, including limitations on integration due to power, area, interconnections, cost and reliability.

The more conventional approach, based on transistors such as silicon MOSFET types and employing standard circuit configurations, typically requires tens to hundreds of transistors plus additional devices per neuron so that the device area is correspondingly quite large. This translates into higher cost and increased complexity in design, and also limits the number of artificial neurons that can be integrated into a monolithically integrated system. This is important in artificial neural systems where the power of the neural approach is achieved by the simultaneous operation of large numbers of relatively slow individual neurons. The drawback in using GaAs-type semiconductor materials is that the technology for compound semiconductor device fabrication is not as well developed (and as inexpensive) as for silicon, although it is certainly adequately advanced so that commercial devices, e.g. semiconductor lasers, are readily available.

A unique approach to mimicking the pulse-mode operation of the neuron in developing a custom artificial electronic neuron is disclosed in *Semiconductor Electronic Concepts for Neural Network Emulation*, by D. D. Coon and A. G. U. Perera, Int. J. Electronics (1987), in which a p-i-n semiconductor diode is operated as a switching element in a relatively simple set of circuits. The operation in these circuits replicates a number of important characteristics of the biological neuron, including threshold behavior, temporal integration, memory, synaptic weighting, excitation and inhibition summation over multiple inputs, and distribution to multiple outputs. However, a substantial barrier to its implementation is its requirement of extremely low temperatures (4.2° K. or −269° C.) for operation of the p-i-n diode. Such low temperatures preclude integration of the device with other conventional devices such as resistors and transistors, and add considerable cost and complexity to its utilization, making this approach impractical.

In the approach of Coon and Perera to mimic the pulse-mode operation of the biological neuron, a p-i-n semiconductor diode is operated as a switching element in a relatively simple set of circuits. The starting point of the switching mechanism is the fact that electrons are trapped at their parent donor atoms in the weakly n-type i-region of the device while in the low conductance mode. When the bias is raised sufficiently, electrons injected into the i-region from the cathode are accelerated and gain sufficient energy to produce impact ionization of trapped electrons from these parent donors. An avalanche multiplication of mobile electrons results, with each electron freed by this impact ionization process leaving behind a positively charged, immobile donor atom. The buildup of this positive charge in the i-region enhances the cathode electric field which ultimately accounts for the switch into a high conductance mode of device operation. The avalanche multiplication process is thus responsible for the device switching from the low to high conductance state.

While the above described mechanism is used by Coon and Perera to produce a p-i-n diode which can switch between low and high conductance current modes, a substantial barrier to its practical implementation is its requirement of extremely low temperatures (4.2° K. or −269° C.) for operation as described above. These very low temperatures are required to ensure that electrons are initially trapped at the donor atoms in the i-region, since the depth of the potential energy well (binding energy) for the electrons is only approximately 25 meV. To ensure binding of electrons at the donors, the mean thermal energy (which is approximately=kT—Boltzmann's constant times temperature) must be much less than the binding energy. For such shallow potential energy wells, switching operation is only possible at extremely low temperatures. At 4.2° K. the mean thermal energy is kT=0.36 meV, but the mean thermal energy at room temperature is kT=26 meV. Such low temperatures (4.2° K.) preclude integration of the device with other conventional devices such as resistors and transistors since this same effect (electron trapping) interferes with normal device operation. Hence, implementation of Coon and Perera's approach based on the low temperature operation of the p-i-n diode adds considerable cost and complexity to its utilization, thereby making this approach impractical.

By comparison, to overcome the low temperature limitations of Coon and Perera's p-i-n diode, a practical diode can be constructed having multiple quantum wells. To construct such a practical diode which can be used in a circuit to emulate a biological neuron, the depth of the quantum wells used to confine the electrons in the low conductance mode should be of the order of hundreds of meV (e.g., 300 meV), which is more than an order of magnitude larger than the binding energy of the donors in the i-regions of Coon and Perera's device. As a result, the operation of such a practical multi-quantum well injection mode diode (multi-well diode), can occur at much higher temperatures, including room temperature where the mean thermal energy is approximately kT=26 meV.

Another reference, Tunneling-assisted impact ionization for a superlattice, by Chuang and Hess, J. *Appl. Phys.* (15 Feb. 1987), discloses an avalanche photodiode which consists of a multi-quantum well structure having several alternating layers of undoped, wide-gap semiconductor and heavily doped, n-type narrow-gap semiconductor layers, having about equal thicknesses. This multi-layer structure is sandwiched between an n+ cathode and a p+ anode which are formed with a narrow-gap semiconductor. Ohmic contacts made to the n+ quantum wells are needed so the avalanche photodiode can replace electrons lost to impact ionization, to maintain the sensitivity of the device to incoming light.

The avalanche photodiode of Chuang and Hess is designed to detect light (photons), and to produce an output electrical signal (current pulse) proportional to the intensity of the incoming light or rate of arrival of photons. In contrast, a practical multi-well diode used to emulate operation of a biological neuron preferably is designed for use in the dark, and to produce an electrical output pulse, wherein its operation in various circuit configurations would be designed to produce a set of output pulses of essentially uniform height and shape, with the output information carried by the frequency of the pulses.

The avalanche photodiode of Chuang and Hess is operated in reverse bias. When the avalanche photodiode is operated at high reverse bias in the dark, minimal leakage current is desired which is constant in time and as small as possible. Since the applied bias is sufficient to produce the avalanching effect, the injection of electrons into the multi-quantum well region must be held to practically zero to prevent premature (in the absence of light) avalanching. To accomplish this the reverse bias mode is used. If the reverse leakage current is not small enough (even temporarily), then avalanching may occur even in the absence of light, producing an unwanted output electrical pulse. These undesirable electrical pulses thus constitute noise in the output signal which can mask the detection of true, optically generated signals.

A practical multi-well diode and the avalanche photodiode of Chuang and Hess are similar in construction, both employing multiple quantum wells and employing the avalanche effect. The avalanching effect in the Chuang and Hess photodiode, however, is not desirable except in the presence of light. While undesirable spontaneous avalanches in the absence of light cannot be completely eliminated in the avalanche photodiode of Chuang and Hess, in contrast, such spontaneous avalanches in the absence of light are the desired effect in a practical multi-well diode used to emulate operation of a biological neuron.

The avalanche photodiode of Chuang and Hess has certain similarities to that required in producing a practical multi-well diode which can be used to emulate a biological neuron. The avalanche photodiode and the multi-well diode, however, are constructed somewhat differently, are biased in a different fashion in their operation, and are employed for different purposes. The avalanche photodiode, as related above, requires ohmic contacts to its n+ quantum wells, whereas the practical multi-well diode does not require such contacts. In fact, such contacts would preclude the proper operation of the multi-well diode in switching to the high conductance mode, since such contacts would prevent the formation of positive space charge in the quantum wells.

The purpose of the avalanche photodiode of Chuang and Hess is to detect photons and produce an electrical output that is proportional to the rate of arrival of the photons. The purpose of a practical multi-well diode is to emulate the operation of a biological neuron in a mode of operation which is not dependent upon the multi-well diode directly receiving any given amount of optical energy.

The avalanche photodiode of Chuang and Hess is operated in reverse bias, whereas a practical multi-well diode is operated in forward bias to encourage electron injection from the cathode to initiate the avalanching effect. The operation of the multi-well diode is similar to the parasitic breakdown mode of operation of the avalanche photodiode.

A further reference, Mechanism of an S-shaped current-voltage characteristic in a Multilayer Isotypic GaAs-AlGaAs heterostructure, by Alferov et al., *Sov. Phys. Semicond.* (March 1987), discloses a multi-hetero-structure having an S-type current-voltage characteristic, which is associated with electron transport across alternating lightly doped, n-type AlGaAs barriers and heavily doped, n-type GaAs layers. A theoretical description of the negative resistance phenomena is given based on collective heating of electrons in the GaAs layers by electrons accelerated in the AlGaAs barriers. The weak temperature dependence observed in the current-voltage characteristics is explained wherein electron tunneling through the AlGaAs barriers is the dominant transport mechanism in the AlGaAs barrier layers. Experimental results are presented which show a weak negative differential resistance region having a threshold voltage of 6–7 volts, and a holding voltage of 5–6 volts.

The threshold and holding voltages of a practical multi-well diode used to emulate operation of a biological neuron are preferably much lower than the 6–7 volts and 5–6 volts disclosed in the above Alferov et al. reference. Biological neurons operate with voltage pulses in the range of several hundred millivolts, and a practical multi-well diode circuit which is to be interfaced with actual biological neurons would have to operate within the same voltage range. In addition, the lower the voltage required for operation, the lower the power required to supply such a practical multi-well diode circuit, and the closer such circuits could be packaged together to make integrated circuit packages having multiple practical multi-well diode circuits.

SUMMARY OF THE INVENTION

Accordingly, it is a primary object of the present invention to provide a multi-well diode that has an S-shaped voltage-current characteristic curve at forward bias so that the dime operates in a low conductance mode on the lower portion of the S-shaped curve until the forward bias exceeds the diode's threshold voltage, at which time it quickly progresses into a high conductance mode on the upper portion of the S-shaped curve.

It is another object of the present invention to provide a multi-well diode that has an S-shaped voltage-current characteristic curve at forward bias at temperatures exceeding 4.2° K., including up to room temperature.

It is yet another object of the present invention to provide a multi-well diode that can be used with a relatively small number of other electronic components to produce circuits that emulate the electrical characteristics of biological neurons.

It is a further object of the present invention to provide an electronic neuron circuit which has a pulse-mode input and a pulse-mode output, wherein the input and output frequencies can be unequal.

It is a yet further object of the present invention to provide an electronic neuron circuit which has a D.C. input and a pulse-mode output, wherein the output frequency is related to the voltage or current level at the D.C. input.

It is still another object of the present invention to provide an electronic neuron circuit which can have both excitatory and inhibitory pulse-mode inputs.

It is yet another object of the present invention to provide an electronic neuron circuit which can have more than one pulse-mode input, and which can weight individual pulse-mode inputs.

It is still a further object of the present invention to provide an electronic neuron circuit which can have more than one pulse-mode output, and which can weight individual pulse-mode outputs.

Yet another object of the present invention is to provide an electronic neuron circuit which can have an optical input by use of an optoelectronic device that converts electromagnetic energy into electrical energy.

Still another object of the present invention is to provide an electronic neuron circuit which can have an optical output by use of an optoelectronic device that converts electrical energy into electromagnetic energy.

Additional objects, advantages and other novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve the foregoing and other objects, and in accordance with the purposes of the present invention as described herein, a multi-quantum well injection mode diode (multi-well diode) is provided having a p-i-n structure, wherein the i-region consists of numerous layers of heavily doped semiconductor quantum wells interspaced between layers of undoped semiconductor beers. The energy band gap of the quantum wells is less than the energy band gap of the barriers. The multi-well diode exhibits an S-shaped current-voltage characteristic curve at forward bias, thereby possessing a low conductance state and a high conductance state, with a strong negative differential resistance region between these two states which is not a stable operating region. The multi-well diode can operate at room temperatures and can, thus, be integrated with other electrical components to make much larger circuits which can operate at room temperature. The multi-well diode can be constructed of semiconductor materials which are readily available in the industry by device-growing techniques which also are readily available in the industry.

The multi-well diode, in combination with a relatively few other electronic components, provides a circuit which can act as an electronic neuron, having electrical characteristics that emulate biological neurons. In one preferred circuit, an electronic neuron is provided that has a pulse-mode input which, upon the arrival of enough electrical energy (charge) via the input pulses, causes the multi-well diode to suddenly turn on (suddenly jump into its high conductance state) thereby generating an output pulse. The frequency of such output pulses is related to the frequency and voltage levels of the input pulses. This circuit is referred to as an "excitatory" circuit, and could be configured to operate with either positive voltage pulses or negative voltage pulses.

In a second preferred circuit, an electronic neuron is provided that has a pulse-mode input which, as it receives input pulses, tends to inhibit the turning on of the multi-well diode. This circuit is referred to as an "inhibitory" circuit, and could be configured to operate with either positive voltage pulses or negative voltage pulses. The inhibitory circuit can be combined with one or more excitatory circuits to control the multi-well diode's behavior in ways that emulate the operation of biological neurons.

Complete electronic neural networks having several hundred (or several thousand) electronic neurons interconnected together can be constructed, wherein each electronic neuron can have multiple excitatory and inhibitory pulse-mode inputs and multiple pulse-mode outputs. Each of the inputs and outputs of each electronic neuron can be weighted, wherein certain of the inputs or outputs become more important than others by allowing (or inhibiting) voltage pulses to more easily pass into or from the electronic neuron.

In a third preferred circuit, an electronic neuron is provided that has a D.C. input which, as the input voltage level exceeds the threshold voltage of the multi-well diode, causes the multi-well diode to turn on, then off, at a frequency which is related to the voltage level at the D.C. input. The output frequency can be slowly varied as the input voltage level is slowly raised or lowered. A very similar circuit could work with a D.C. current input which, as the input current causes a voltage to appear across the multi-well diode which exceeds the threshold voltage of the multi-well diode, causes the multi-well diode to turn on, then off, at a frequency which is related to the current level at the D.C. input.

In a fourth preferred circuit, an electronic neuron is provided that has an optical input which uses an optoelectronic device to convert electromagnetic energy (light) into electrical energy. The output frequency is proportional to the intensity of the received light, thus making this circuit attractive for use in applications where information to be analyzed is already in optical form.

In a fifth preferred circuit, an electronic neuron is provided that has an optical output which uses an optoelectronic device to convert electrical energy into electromagnetic energy (light). The electrical pulse-mode output is used to modulate the intensity of an LED or semiconductor laser, thus producing a pulsed optical output. The input to the circuit could be configured to accept either a voltage or current signal, and the signal could be of either a D.C. or pulse mode type. A pulse mode input could be configured to operate with either positive voltage (or current) pulses or negative voltage (or current) pulses. This circuit could be combined with the above optical input electronic neuron circuit, thereby producing an electronic neuron having both an optical input and an optical output. Such a circuit would be completely electrically isolated from other circuitry and would, thus, be quite immune to electromagnetic interference.

Still other objects of the present invention will become apparent to those skilled in this art from the following description wherein there is shown and described a preferred embodiment of this invention, simply by way of illustration, of one of the best modes contemplated for carrying out the invention. As will be realized, the invention is capable of other different embodiments, and its several details are capable of modification in various, obvious aspects all without departing from the invention. Accordingly, the drawing and descriptions will be regarded as illustrative in nature and not as restrictive.

BRIEF DESCRIPTION OF THE DRAWING

The accompanying drawing incorporated in and forming a part of the specification illustrates several aspects of the present invention, and together with the description serves to explain the principles of the invention. In the drawing:

FIG. 1B is the energy band diagram of the multi-quantum well injection mode diode of FIG. 1A, at a time when that diode is in its low conductance state.

FIG. 1C is the energy band diagram of the multi-quantum well injection mode diode of FIG. 1A, at a time when that diode is in its high conductance state.

DETAILED DESCRIPTION OF THE PREFERRED EMBODIMENT

Reference will now be made in detail to the present preferred embodiment of the invention, an example of which is illustrated in the accompanying drawing, wherein like numerals indicate the same elements throughout the views.

Figure 1A:
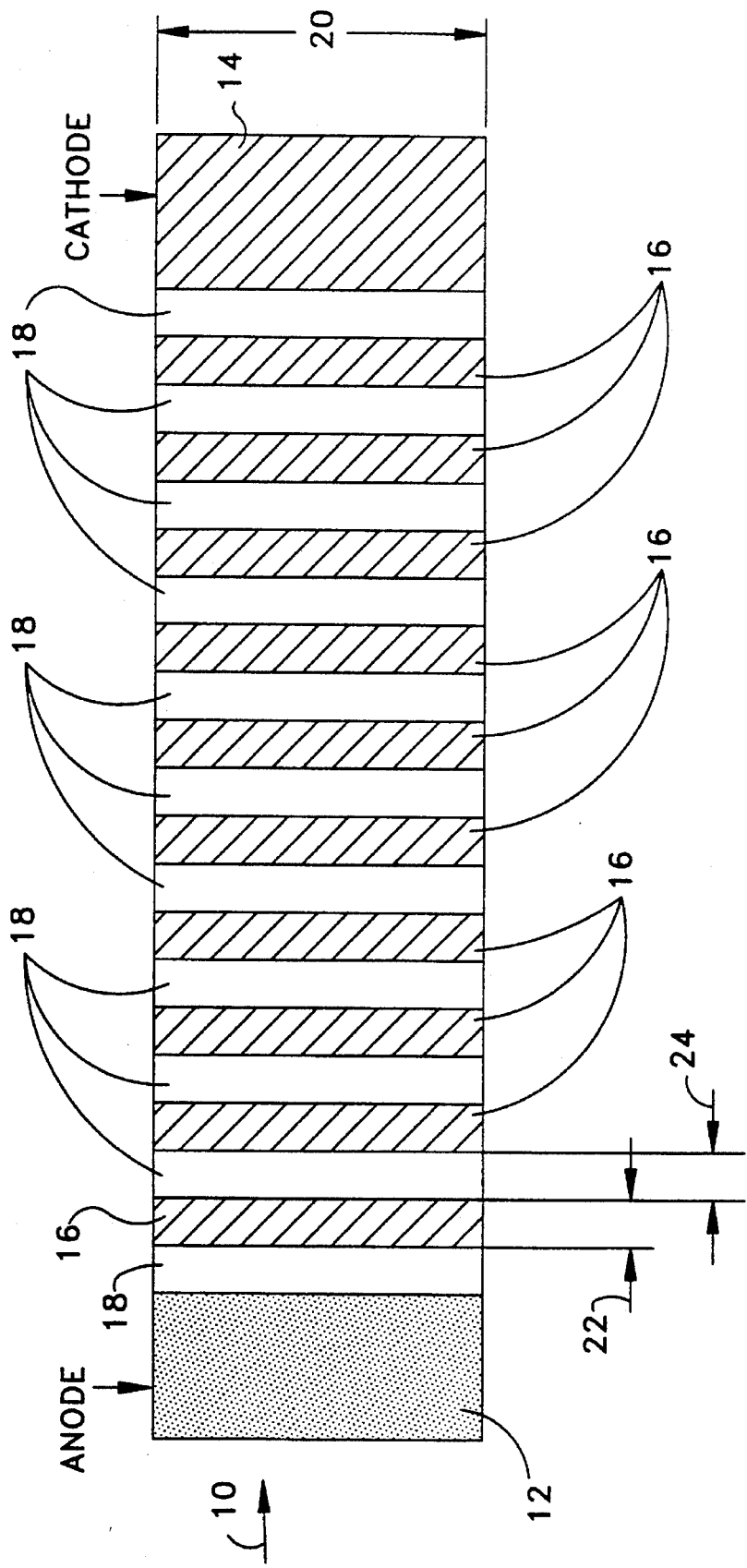
FIG. 1A is a cross-section view of a multi-quantum well injection mode diode constructed in accordance with the principles of the present invention.

Referring to FIG. 1A, a multi-quantum well injection mode diode (multi-well diode) 10 is depicted as having several various semiconductor layers. Multi-well diode 10 is constructed such that it is useful for artificial pulse-mode electronic neural systems. Multi-well diode 10 has a p-i-n diode structure, wherein the i-region consists of a multi-quantum well structure, preferably consisting of heavily doped n-type gallium arsenide (GaAs) quantum wells 16 and undoper aluminum arsenide (AlAs) barriers 18, such layers of wells 16 and barriers 18 being alternately deposited next to one another. Completing the i-region of multi-well diode 10 are semiconductor end pieces which are undoped AlAs barriers 18. At opposite ends of the i-region are a cathode 14, preferably made of doped n-type gallium arsenide (GaAs), and an anode 12, preferably made of doped p-type gallium arsenide (GaAs). The quantum wells 16 are also referred to as deep wells.

The junctions between the two types of semiconductors must be manufactured according to modern epitaxial techniques. A preferred epitaxial technique for constructing multi-well diode 10 is molecular beam epitaxy. These junctions must each have a nearly atomically perfect interface between the two semiconductors, in which both semiconductors must be single crystal and their lattice constants must be nearly perfectly matched. One semiconductor simply deposited on the other will produce such a poor interface that the device will not work at all.

In a preferred embodiment of multi-well diode 10, the overall depth dimension, designated by the numeral 20, is 55 microns (55 micrometers), the width dimension of deep well 16, depicted by the numeral 22, is 500 Angstroms, and the width dimension of each barrier 18, depicted by the numeral 24, also is 500 Angstroms. Using the above-preferred materials, and built to the above-preferred dimensions, multi-well diode 10 exhibits an S-type current-voltage characteristic at room temperature in forward bias (wherein the anode has a positive voltage applied as compared to the cathode) with a threshold voltage of a few volts (e.g., 1.5 volts), and a minimum holding condition which occurs at a bias voltage of approximately 0.4 volts and at a current on the order of one nanoAmpere. Other threshold and holding voltage values can be achieved by use of different semiconductor materials or by changing the dimensions of the well and barrier layers.

FIGS. 1B and 1C are helpful in explaining the above-mentioned S-type current-voltage characteristics. Referring to FIG. 1B, the curve depicted by the numeral 30 represents the conduction band edge of multi-well diode 10 while in its low conductance state. The curve depicted by the numeral 32 represents the valence band edge of multi-well diode 10 while in its low conductance state. The combination of curves 30 and 32 of FIG. 1B is described as the energy band diagram and in the low conductance mode of multi-well diode 10. The current is very low (less than one microAmpere) at a small forward bias voltage. Each circle designated by the numeral 34 represents an electron which is temporarily located in the vicinity of an ionized donor atom 36 in one of the deep wells 16, or in the cathode 14. At room temperature, most electrons 34 have sufficient thermal energy to escape from their parent donor atoms 36, but not enough thermal energy to escape the deep wells 16.

The circle designated by the numeral 38 represents an electron which is moving across one of the barriers 18, thus exhibiting the very low leakage current (which is less than one microAmpere) of the multi-well diode 10 in its low conductance state. This low conductance leakage current is limited by thermionic emission of electrons over the conduction band discontinuity at the cathode, as well as by thermionic emission over the barriers 18 between wells 16. As seen in FIG. 1B, while in the low conductance state, the cathode's electric field 44 (depicted by the vector $E_c$) is equal to the anode's electric field 46 (depicted by the vector $E_a$).

The energy band diagram of FIG. 1B has a Y-axis in units of energy, typically in electron-volts (eV), and has an X-axis in units of distance, typically in Angstroms. In this case, the X-axis of the energy band diagram represents distance as one crosses the i-region of multi-well diode 10. As can be seen in FIG. 1B, the energy band gap (that energy required to move an electron from the valence band edge 32 to the conduction band edge 30) is narrowest at each of the deep wells 16, as depicted by the numeral 40 in FIG. 1B, and is broadest at each of the barriers 18, as depicted by the numeral 42. The band gaps 40 and 42 are dependent upon the semiconductor material used to create the deep wells 16 and the barriers 18. Many different semiconductor materials as described below, exhibit band gap characteristics which can be useful in creating multi-well injection mode diodes. In the illustrated embodiment, multi-well diode 10 has band gap characteristics as follows: (1) band gap 40, for deep wells 16 made of doped n-type gallium arsenide, is approximately 1.4 eV; (2) band gap 42, for the barrier 18 constructed of undoped aluminum arsenide, is approximately 2.1 eV.

Charge flows in the low conductance state due to electron injection at the cathode 14 and electron transport from one well 16 to another. The electron injection process entails individual electrons 38 entering the i-region from cathode 14 and going over the first barrier 18, which is substantially limited at low bias of multi-well diode 10. The same process limits the flow of electrons from one quantum well 16 to another, providing an extremely small current. The low electric fields involved are insufficient to produce impact ionization, which occurs when one electron enters but two electrons leave a well 16. The symmetry of the i-region structure (all the wells 16 and barriers 18 are identical in physical size) and the low electric fields involved in the low conductance state cause the wells 16 to remain essentially electrically neutral, in which there are equal numbers of electrons and ionized donors in the wells 16 (since the flow of electrons 38 into each well 16 is matched by the flow out of the well 16). The energy gained by electrons 38 which are accelerated in a barrier 18 is small compared to the height of the barrier 18 (in terms of energy band diagram conduction band 30), and cannot produce an avalanche effect, since the additional energy is only enough for one electron (either the entering electron or one other electron, but not both) to leave the well 16.

When the bias is sufficiently large, i.e., greater than the threshold voltage, the electric field 44 at cathode 14 becomes sufficiently large to cause electron acceleration in the barrier layers 18 sufficient to produce impact ionization of electrons out of the quantum wells 16. In this state, the energy gained by an electron 58 in accelerating across a barrier 18 is significant enough that it can give enough energy to another electron 54 located in a well 16 (see FIG. 1C) so that the other electron 54 can escape while the first electron 58 has enough energy to escape itself. This behavior characterizes the impact ionization process, in which more electrons are escaping the well 16 than are incoming. Since the quantum wells 16 are electrically isolated, a positive charge is created when electrons leave the wells 16. This positive charge enhances the cathode's electric field 64, which encourages further electron injection and additional positive charge formation, with the process building up in a positive feedback manner until the device 10 switches to the high conductance state. This process is quite different than the prior art Alferov et at. reference, in which an electron accumulates energy from multiple collisions with incoming electrons sufficient to tunnel through the barriers (made of AlGaAs in Alferov et al.), and which requires a much larger threshold voltage.

FIG. 1C depicts the energy band diagram of multi-well diode 10 while in its high conductance state. As seen in FIG. 1C, while in the high conductance state, the cathode's electric field 64 (depicted by the vector $E_c$) is quite large, thus producing a dramatically larger electron injection and current (greater than 100 microAmperes) at the same bias. The corresponding anode field 66 (depicted by the vector $E_a$) is very small, and in fact is near zero. As the bias is reduced, multi-well diode 10 stays in the high conductance state until the applied voltage drops to a value which is less than the minimum holding condition, which occurs at a voltage of about 0.4 volts, corresponding to the cathode field 64 and current dropping below the minimum values needed to sustain impact ionization. At this minimum bias and current level, the cathode field 64 becomes too weak to produce adequate positive charge generation so that electron trapping in the wells 16 from electrons 58 injected from the cathode 14 occurs and neutralizes the positive space charge remaining in the wells 16. Eventually all of the wells 16 become neutralized, and the multi-well diode 10 reverts back into its low conductance state having a uniform electric field across each of the barriers 18.

The details of FIG. 1C are quite similar to those of FIG. 1B. The conduction band edge for the high conductance state is designated by the numeral 50. The valence band edge for the high conductance state is designated by the numeral 52. The circle designated by the numeral 54 represents an electron which is detached from its ionized donor 56, but confined to the deep well 16. A large number of electrons, represented by the numeral 58 are moving through the i-region of the multi-well diode 10. The band gap at the deep wells 16 is designated by the numeral 60 for the high conductance state, and the band gap at the barriers 18 is given by the numeral 62 for the high conductance state. The deep well band gap 60 of FIG. 1C has the same magnitude as the deep well band gap 40 of FIG. 1B (i.e., 1.4 eV), and the barrier band gap 62 of FIG. 1C has the same magnitude as the barrier band gap 42 of FIG. 1B (2.1 eV).

Figure 2A:
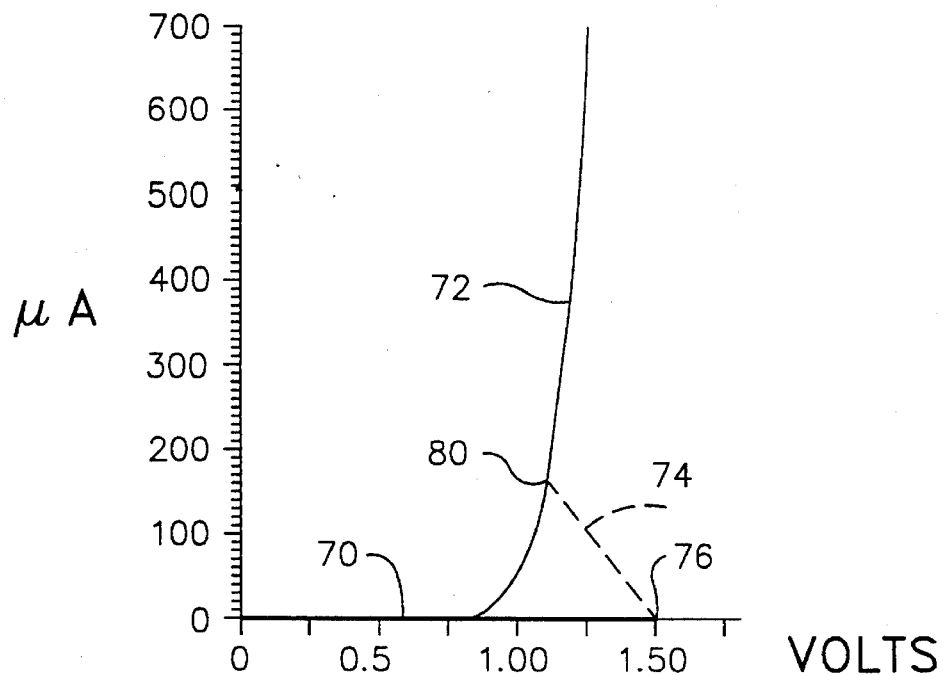
FIG. 2A is the current-voltage characteristic curve of the multi-quantum well injection mode diode of FIG. 1A at a small forward bias, plotted on a linear Y-axis.
Figure 2B:
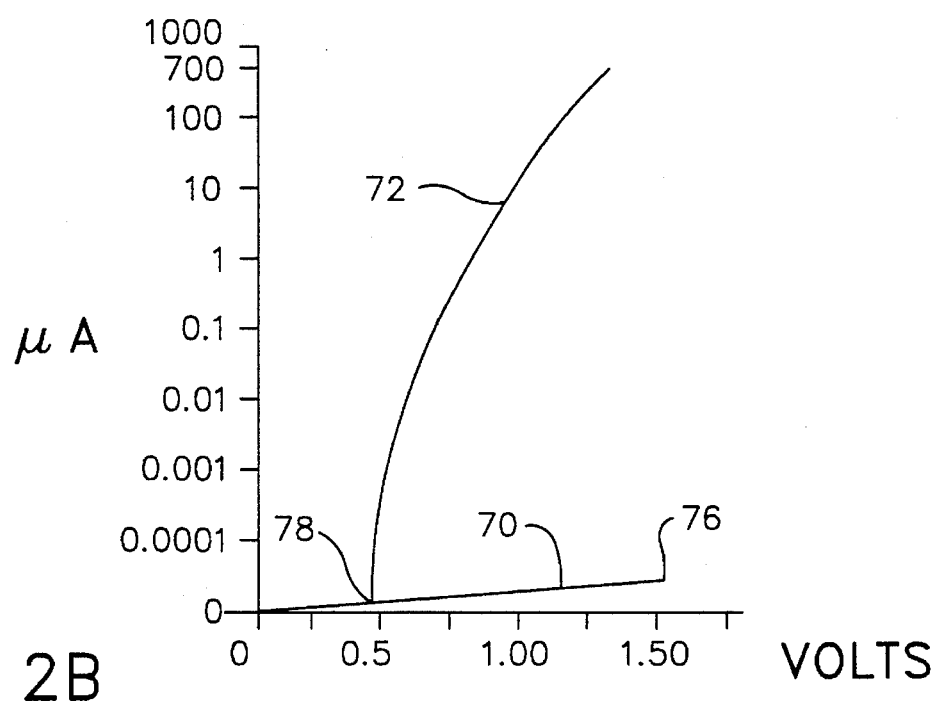
FIG. 2B is the current-voltage characteristic curve of the multi-quantum well injection mode diode of FIG. 1A at a small forward bias, plotted on a logarithmic Y-axis.

FIGS. 2A and 2B depict the current-voltage characteristics of the multi-well diode 10, as constructed according to the principals of the present invention, at a small forward bias voltage. FIGS. 2A and 2B each depict two separate curves, a low conductance current-voltage curve 70, and a high conductance current-voltage curve 72. The unusual S-type current-voltage characteristic referred to above is represented by the low conductance curve 70, the dashed curve 74, and the high conductance curve 72 on FIG. 2A. The dashed portion 74 of the S-curve on the current-voltage characteristic curve is an unstable region in which the multi-well diode 10 cannot remain operating. The dashed portion 74 represents a load line having a slope equal to negative one divided by the series resistance of multi-well diode 10:

$$\text{Slope} = \frac{-1}{R_{SERIES}}$$

The dashed portion 74 of the S-curve exhibits a strong negative differential resistance region which has not been successfully demonstrated in the past for a diode that can operate at low voltages and at room temperatures.

For example, if multi-well diode 10 had been operating in the low conductance state, and the bias becomes larger than the threshold voltage 76, then the multi-well diode 10 device can no longer remain on the low conductance current-voltage curve 70, but instead, jumps suddenly into the unstable region 74 of the S-curve. Multi-well diode 10 only remains within this unstable region 74 long enough for the positive feedback effect to build up positive charge in the deep wells 16 until the multi-well diode 10 switches into the high conductance state. As soon as the multi-well diode 10 devices switches into the high conductance state, it then begins to operate on the high conductance current-voltage curve 72 at the point designated by the numeral 80 where it intersects the dashed load line 74. As the bias increases, multi-well diode 10 continues to operate on the high conductance current-voltage curve 72, thus increasing its current dramatically. As the bias decreases, the multi-well diode continues to operate on the high conductance current-voltage curve 72 until the applied voltage drops to a value below the minimum holding condition, designated by the numeral 78 (and is generally referred to as multi-well diode's holding "voltage"), which as can be seen on FIG. 2B, occurs around 0.4 volts and less than one nanoAmpere. At this small bias the cathode field is insufficient to produce impact ionization, and injected electrons again, become trapped in the deep wells 16. Upon this occurrence, the forward current has fallen to a near-zero value, thus placing multi-well diode 10 back into the low conductance state on the low conductance current-voltage curve 70.

The operation of multi-well diode 10, as discussed above, depends upon the electron impact ionization rate abruptly increasing just above the threshold voltage 76, and then saturating, thus placing multi-well diode 10 into the high conductance state. The ionization rate is determined by the number of occupied sub-bands (allowed quantum mechanical electron energy levels above the conduction band edge in the deep wells 16), and the threshold voltage 76 depends upon the highest occupied sub-band. The occupation of sub-bands is affected by parameters such as the width of the deep well 16, the doping density of deep well 16, and the width of barrier 18.

As the width 22 of the deep well 16 increases, the more sub-bands are occupied so that the ionization rate becomes larger. The highest occupied sub-bands, however, are almost the same as compared to the original width of the well, thereby resulting in the same threshold voltage requirements. As the doping density of the deep well 16 increases, the number of occupied sub-bands are increased, thereby resulting in a larger ionization rate and a smaller threshold voltage requirement. As the width 24 of barrier 18 is increased, the ionization rate is decreased, and the threshold voltage requirements become larger.

Another effect of an increased width 24 of barrier 18 is that the output frequency, discussed below, of multi-well dime 10 decreases. Another physical parameter which affects such output frequency is temperature. At lower temperatures, the injection current is decreased, thereby resulting in lower output frequencies.

Other semiconductor materials can be used to form the deep wells 16 and the barriers 18 of multi-well diode 10. Such semiconductor materials must be selected in pairs, wherein the material of deep well 16 must exhibit a narrow-energy gap characteristic between its conduction band edge and its valence band edge, and the material of barrier 18 must exhibit wide-gap energy band characteristics as compared to the deep well's energy band characteristics. A list of such wide-gap and narrow-gap semiconductor pairs can include a large number of various semiconductor materials, however, it will be understood that not all pairs of materials will work properly, and particularly that all material pairs will not work properly at room temperature. For example, in the illustrated embodiment described above, the wide-gap semiconductor material is AlAs, and the narrow-gap semiconductor material is GaAs. The use of these materials allows for an multi-well diode 10 which achieves proper operation at room temperature.

If, for example, the wide-gap semiconductor material used in the barrier 18 should include some gallium, such as in the semiconductor $Al_{0.2}Ga_{0.8}As$, then multi-well diode 10 constructed of such materials may not work above 77° K. Although 7° K. is a large improvement in performance over the prior art which would not work much above 4.2° K., it still is a severe limitation as compared to such devices that could work at room temperature.

A partial list of wide-gap/narrow-gap semiconductor combinations that are possible for use in multi-well diode devices, such as that disclosed above, is given below:

| WIDE-GAP SEMICONDUCTOR | NARROW-GAP SEMICONDUCTOR |
| --- | --- |
| AlAs | GaAs |
| | $Al_xGa_{1-x}As$ |
| | $In_xGa_{1-x}As$ |
| | InAs |
| | $Al_xIn_{1-x}As$ |
| | InP |
| | $In_xGa_{1-x}P$ |
| | InSb |
| | GaSb |
| | $InAs_ySb_{1-y}$ |
| | $GaAs_ySb_{1-y}$ |
| | $Ga_xIn_{1-x}As_yP_{1-y}$ |
| | $Ga_xIn_{1-x}As_ySb_{1-y}$ |
| | $Ga_xAl_{1-x}As_ySb_{1-y}$ |
| | Si |
| | Ge |
| $Al_xGa_{1-x}As$ | GaAs |
| | $Al_xGa_{1-x}As$ |
| | $In_xGa_{1-x}As$ |
| | InAs |
| | $Al_xIn_{1-x}As$ |
| | InP |
| | $In_xGa_{1-x}P$ |
| | InSb |
| | GaSb |

-continued

| WIDE-GAP SEMICONDUCTOR | NARROW-GAP SEMICONDUCTOR |
|---|---|
| | $InAs_ySb_{1-y}$ |
| | $GaAs_ySb_{1-y}$ |
| | $Ga_xIn_{1-x}As_yP_{1-y}$ |
| | $Ga_xIn_{1-x}As_ySb_{1-y}$ |
| | $Ga_xAl_{1-x}As_ySb_{1-y}$ |
| | Si |
| | Ge |
| InP | $In_xGa_{1-x}As$ |
| | InAs |
| | $Al_xIn_{1-x}As$ |
| | InSb |
| | GaSb |
| | $InAs_ySb_{1-y}$ |
| | $GaAs_ySb_{1-y}$ |
| | $Ga_xIn_{1-x}As_yP_{1-y}$ |
| | $Ga_xIn_{1-x}As_ySb_{1-y}$ |
| | $Ga_xIn_{1-x}As_ySb_{1-y}$ |
| | Si |
| | Ge |
| $Al_xIn_{1-x}As$ | $In_xGa_{1-x}As$ |
| | InAs |
| | $Al_xIn_{1-x}As$ |
| | InSb |
| | GaSb |
| | $InAs_ySb_{1-y}$ |
| | $GaAs_ySb_{1-y}$ |
| | $Ga_xIn_{1-x}As_yP_{1-y}$ |
| | $Ga_xIn_{1-x}As_ySb_{1-y}$ |
| | $Ga_xIn_{1-x}As_ySb_{1-y}$ |
| | Si |
| | Ge |
| Si | Ge |
| | $In_xGa_{1-x}As$ |
| | InAs |
| | $GaAs_ySb_{1-y}$ |
| | InSb |
| | $In_xGa_{1-x}Sb$ |
| | $InAs_ySb_{1-y}$ |
| Amorphous Si | Si |
| | Ge |
| | $In_xGa_{1-x}As$ |
| | InAs |
| | $GaAs_ySb_{1-y}$ |
| | InSb |
| | $In_xGa_{1-x}Sb$ |
| | $InAs_ySb_{1-y}$ |
| SiC | Si |
| | amorphous Si |
| | Ge |
| | $In_xGa_{1-x}As$ |
| | InAs |
| | $GaAs_ySb_{1-y}$ |
| | InSb |
| | $In_xGa_{1-x}Sb$ |
| | $InAs_ySb_{1-y}$ |
| Diamond | Si |
| | amorphous Si |
| | SiC |
| | Ge |
| | $In_xGa_{1-x}As$ |
| | InAs |
| | $GaAs_ySb_{1-y}$ |
| | InSb |
| | $In_xGa_{1-x}Sb$ |
| | $InAs_ySb_{1-y}$ |

Figure 3A:
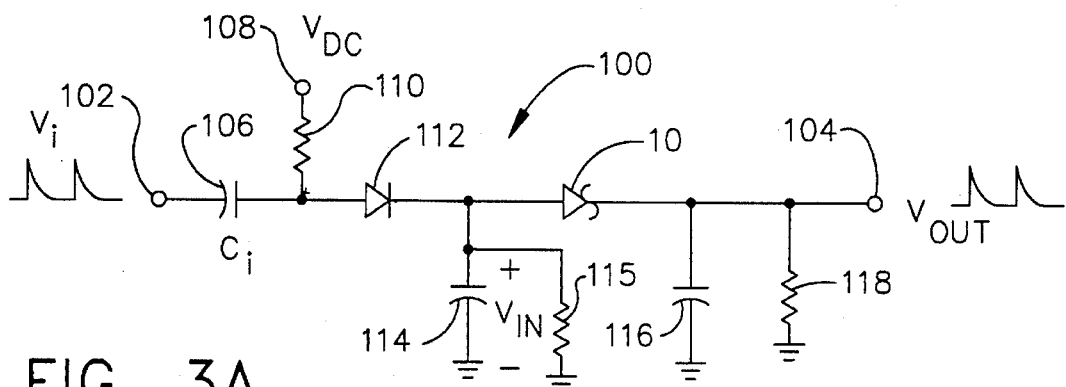
FIG. 3A is an electrical schematic diagram of an electronic neuron circuit having an excitatory pulse-mode input and a pulse-mode output.

FIG. 3A depicts an electronic neuron circuit 100 of the excitatory type, having a pulse-mode input. Pulse-mode input signals $V_i$ can be accepted and integrated on an input integrating capacitor 114. Pulse-mode input signals $V_i$ are received at a location designated by the numeral 102, and are passed through an input weighting capacitor 106 ($C_i$). A DC voltage source 108 biases the input signal diode 112 through the use of input biasing resistor 110. The effect of this biasing is to rectify all pulse inputs via rectifying diode 112. As discussed above, the pulse-mode input signals $V_i$, now having been rectified, are integrated on input integrating capacitor 114, thus producing an input voltage $V_{IN}$. Once the voltage $V_{IN}$ is increased to exceed the threshold voltage 76 of multi-well diode 10, then an output pulse $V_{OUT}$ is generated upon the occurrence of multi-well diode 10 going into its high-conductance state, charging the output toad capacitor 116, and subsequently returning to its low conductance state when the voltage across the multi-well diode becomes less than the holding voltage 78.

A short-term memory resistor 115 is provided in parallel to input integrating capacitor 114, so that in situations where one or more input pulses $V_i$ are received by electronic neuron circuit 100 which are not sufficient to cause multi-well diode 10 to be driven into its high-conductance state, and if thereafter no more input pulses $V_i$ are received for a predetermined time period, then resistor 115 can slowly discharge input integrating capacitor 114. As input integrating capacitor 114 is being discharged, the voltage $V_{IN}$ across it will decrease, thereby making it more difficult for later input pulses $V_i$ to add sufficient charge to recharge input integrating capacitor 114 and increase the input voltage $V_{IN}$ above the threshold level of multi-well diode 10, and thus driving multi-well diode 10 into its high conductance state. The overall effect of this portion of electronic neuron circuit 100 is to achieve a "short-term memory" function, wherein the electronic neuron is more easily stimulated by multiple input pulses which occur sooner rather than those that occur later.

Output pulse $V_{OUT}$ occurs at a location designated by the numeral 104, and has a parallel R-C combination output load, capacitor 116 and resistor 118. Output load capacitor 116 and output load resistor 118 create a time constant which shapes $V_{OUT}$ as it drops from its maximum value toward zero.

Figure 3B:
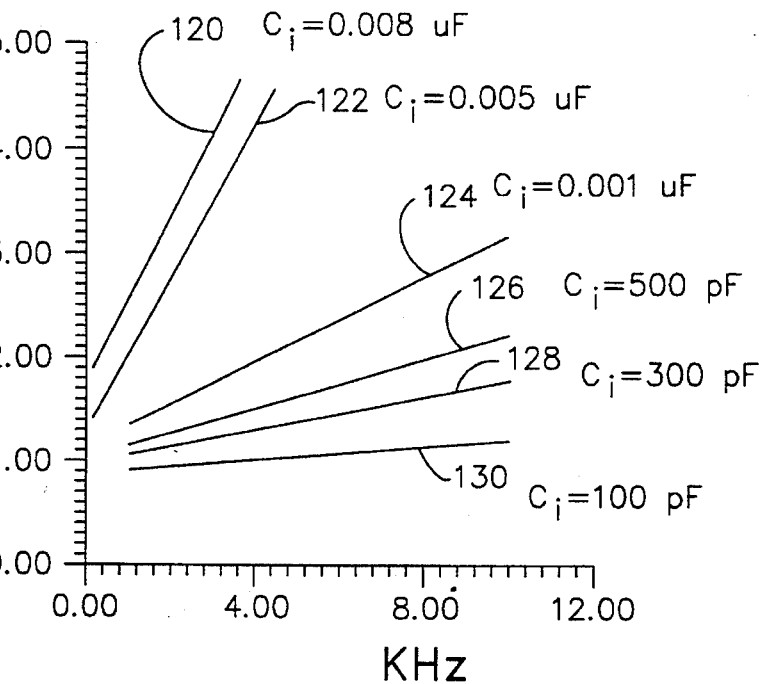
FIG. 3B is a set of curves depicting the characteristic output frequency versus input frequency of the circuit of FIG. 3A, wherein the effect of different values of the input weighting capacitor are given.

The output frequency of $V_{OUT}$ is linearly related to the input frequency of $V_i$. The input coupling capacitor $C_i$ serves as a proportionality factor which is analogous to synaptic weighting in biological neural systems. In other words, coupling capacitor 106 ($C_i$) acts as a weighting capacitor which directly affects the output frequency versus the input frequency, as shown in FIG. 3B, wherein the Y-axis represents the output frequency in kHz and the X-axis represents the input frequency in kHz. As can be seen in FIG. 3B, the output frequency (the Y-axis) is of the order of a few kilohertz, and the peak amplitude of $V_{OUT}$ is around a few hundred millivolts, both of which are of the same or larger magnitude than the biological neuron's corresponding values.

The curves in FIG. 3B represent the following capacitance values for input coupling capacitor 106 ($C_i$); the curve designated by the numeral 120 represents a capacitance value of 0.008 uf; the curve represented by the numeral 122 is for capacitance value of 0.005 uf; the curve represented by the numeral 124 is for capacitance value of 0.001 uf: the curve represented by the numeral 126 is for a capacitance value of 500 pF; the curve represented by the numeral 128 is for a capacitance value of 300 pF; and the curve represented by the numeral 130 is for a capacitance value of 100 pF. The D.C. biasing of input diode 112, by adjusting the D.C. bias voltage 108 or the value of the biasing resistor 110, can also be used to modify the efficiency with which input pulses couple charge onto input integrating capacitor 114, i.e., to modify the synaptic weight.

The circuit of FIG. 3A is called an excitatory circuit because, as input pulses are received at 102, they tend to excite the multi-well diode 10 into outputting a pulse at 104. A circuit which produces the opposite effect for the same type of positive-going input pulses is given in FIG. 4.

Figure 4:
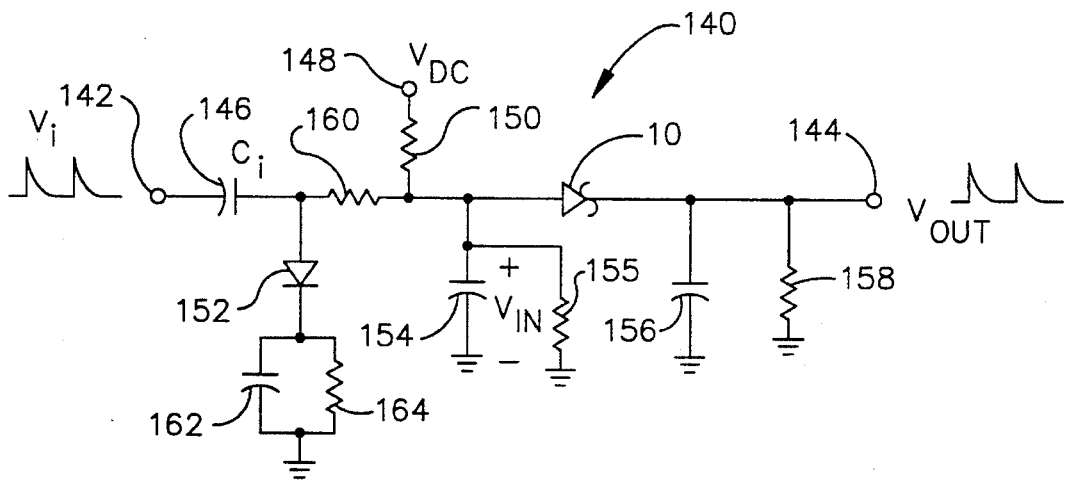
FIG. 4 is an electrical schematic diagram of an electronic neuron circuit having an inhibitory pulse-mode input, and a pulse-mode output.

The circuit of FIG. 4 is described as an electronic neuron circuit which is inhibitory in its operation. Electronic neuron circuit 140 accepts pulse-mode input signals $V_i$ at its input 142 and outputs pulse-mode signals $V_{OUT}$ at the location designated by the numeral 144. More input pulses $V_i$ result in fewer output pulses $V_{OUT}$, which is exactly the opposite of the excitatory circuit of FIG. 3A. As an input pulse $V_i$ is received at 142 during the rising portion of the pulse, positive charge travels through the input coupling capacitor 146 ($C_i$) and through rectifying diode 152, then enters an input RC combination comprising capacitor 162 and resistor 164. The resistor 160 blocks charge flow onto the input integrating capacitor 154 during this time. During the falling portion of the input pulse, charge is drawn from the input integrating capacitor 154 to discharge the input coupling capacitor 146 ($C_i$).

Electronic neuron circuit 140 uses a DC voltage source 148 which biases the circuit through an input biasing resistor 150. The D.C. voltage source 148 magnitude should be greater than the threshold voltage 76 of multi-well diode 10, so that in the absence of any input pulses arriving at the input 142, the input integrating capacitor 154 will be charged to some steady state voltage. If this voltage $V_{IN}$ is greater than the threshold voltage 76 of multi-well diode 10, then multi-well diode 10 will switch to its high conductance state and discharge input integrating capacitor 154 so that a steady stream of pulses will appear at the output 144. As incoming pulse-mode signals $V_i$ are received at 142, the combination of rectifying diode 152 and the input RC combination of capacitors 162 and resistor 164 tend to remove a certain quantity of charge from input integrating capacitor 154 so that the frequency of output pulses is reduced in proportion to the frequency of incoming pulses.

Assuming input integrating capacitor 154 already has accumulated some charge due to input pulses received by excitatory circuitry not depicted in FIG. 4, a voltage $V_{IN}$ will exist across input integrating capacitor 154. If $V_{IN}$ is not large enough to exceed the threshold voltage 76 of multi-well diode 10, then an output pulse $V_{OUT}$ at 144 will not yet occur. As an input pulse $V_i$ is received at 142, a certain amount of charge will be removed from input integrating capacitor 154 through resistor 160, diode 152, and the RC combination of capacitor 162 and resistor 164. This has an inhibitory effect upon the operation of multi-well diode 10, which cannot go into its high conductance state until its voltage threshold 76 is exceeded (by the voltage $V_{IN}$). Once multi-well diode 10 outputs a pulse $V_{OUT}$, such pulse has the peak amplitude of a few hundred millivolts, which is the same or larger in magnitude than that of the biological neuron. Output load capacitor 156 and output load resistor 158 create a time constant which shapes $V_{OUT}$ as it drops from its maximum value toward zero.

A short-term memory resistor 155 is provided in parallel to input integrating capacitor 154, so that in situations where one or more excitatory input pulses are received by electronic neuron circuit 140 (through circuitry not depicted on FIG. 4) which are not sufficient to cause multi-well diode 10 to be driven into its high-conductance state, and if thereafter no more excitatory input pulses are received for a predetermined time period, then resistor 155 can slowly discharge input integrating capacitor 154. As input integrating capacitor 154 is being discharged, the voltage $V_{IN}$ across it will decrease, thereby making it more difficult for later excitatory input pulses to add sufficient charge to recharge input integrating capacitor 154 by increasing input voltage $V_{IN}$ above the threshold level of multi-well diode 10, and thus driving multi-well diode 10 into its high conductance state.

Figure 5:
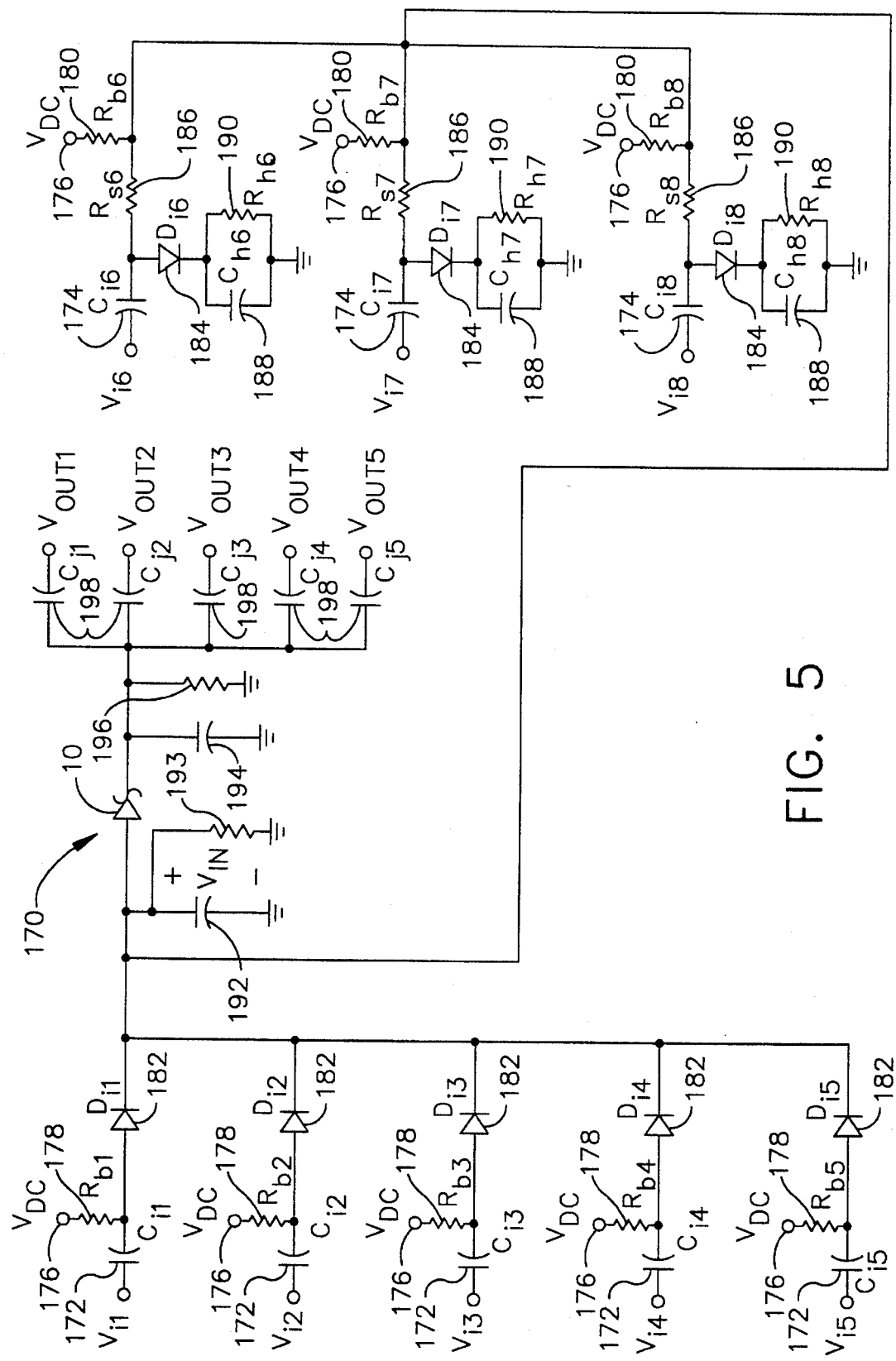
FIG. 5 is an electrical schematic diagram of an electronic neuron circuit having multiple pulse-mode inputs of both excitatory and inhibitory type, and multiple pulse-mode outputs.

FIG. 5 depicts an electronic neuron circuit 170 which has multiple inputs and multiple outputs, all operating in the pulse mode. Electronic neuron circuit 170 combines the features of the excitatory circuit 100 and the inhibitory circuit 140. Inputs $V_{i1}$, $V_{i2}$, $V_{i3}$, $V_{i4}$ and $V_{i5}$ are all excitatory-type inputs. Inputs $V_{i6}$, $V_{i7}$, and $V_{i8}$ are all inhibitory-type inputs. Each of the excitatory inputs accepts a pulse-mode input which passes through an input coupling capacitor 172 ($C_{i1}$, $C_{i2}$, $C_{i3}$, $C_{i4}$, and $C_{i5}$), is biased by a voltage $V_{DC}$ at the location 176 through a biasing resistor 178 ($R_{b1}$, $R_{b2}$, $R_{b3}$, $R_{b4}$, and $R_{b5}$), and further passes through a rectifying diode 182 ($D_{i1}$, $D_{i2}$, $D_{i3}$, $D_{i4}$, and $D_{i5}$), after which all of the inputs are tied together at a common node. Rectifying diodes $D_{i1}$–$D_{i5}$ also isolate one excitatory input circuit from the next.

In a similar fashion, the inhibitory inputs are passed through an input coupling capacitor 174 ($C_{i6}$, $C_{i7}$, and $C_{i8}$). A DC voltage source 176 biases the circuit through input biasing resistor 180 ($R_{b6}$, $R_{b7}$, and $R_{b8}$). The remaining circuit elements in this portion of the circuit, series resistor 186 ($R_{s6}$, $R_{s7}$, $R_{s8}$), diode 184 ($D_{i6}$, $D_{i7}$, $D_{i8}$), capacitor 188 ($C_{h6}$, $C_{h7}$, $C_{h8}$), and resistor 190 ($R_{h6}$, $R_{h7}$, $R_{h8}$), all act in an inhibitory fashion, in the same manner as the circuit disclosed in FIG. 4. Each of the inhibitory inputs are connected together at one common node after biasing resistor 176. As an input pulse is received, at $V_{i6}$, $V_{i7}$, or $V_{i8}$, a certain amount of charge which has accumulated on input integrating capacitor 192 will be removed, thus reducing the voltage across that capacitor $V_{IN}$. This tends to block (inhibit) received input pulses at the excitatory inputs ($V_{i1}$, $V_{i2}$, $V_{i3}$, $V_{i4}$ and $V_{i5}$) from producing output pulses, by preventing the occurrence of a change of state from a low conductance state to a high conductance state of multi-well diode 10. Resistors $R_{s6}$–$R_{s8}$ also isolate one inhibitory input circuit from the next.

Multi-well diode 10 cannot produce an output pulse until $V_{IN}$ has exceeded the threshold voltage 76 of multi-well diode 10. This will not occur unless the voltage pulses received at the excitatory inputs $V_{i1}$–$V_{i5}$ cumulatively outweigh the inhibitory inputs $V_{i6}$–$V_{i8}$, so that the voltage buildup $V_{IN}$ on input integrating capacitor 192 is at least the threshold voltage 76 required to place multi-well diode 10 into its high conductance state. Once that occurs, an output pulse will be generated and will be communicated to all of the multiple outputs shown in FIG. 5. An output pulse will be sent through each of the output coupling capacitors 198 ($C_{j1}$, $C_{j2}$, $C_{j3}$, $C_{j4}$, and $C_{j5}$) and finally to the outputs $V_{OUT1}$, $V_{OUT2}$, $V_{OUT3}$, $V_{OUT4}$, and $V_{OUT5}$. The output pulse amplitude will depend on the total capacitive load on the output. The output loading capacitor 194, together with the output coupling capacitors 198 ($C_{j1}$, $C_{j2}$, $C_{j3}$, $C_{j4}$, and $C_{j5}$), and the output load resistor 196 form an output RC combination, creating a time constant which shapes the OFF-state negative slope of all of the output pulses.

A short-term memory resistor 193 is provided in parallel to input integrating capacitor 192, so that in situations where one or more excitatory input pulses $V_{i1}$–$V_{i5}$ are received by electronic neuron circuit 170 which are not sufficient to cause multi-well diode 10 to be driven into its high-conductance state, and if thereafter no more input pulses $V_{i1}$–$V_{i5}$ are received for a predetermined time period, then resistor 193 can slowly discharge input capacitor 192. As input integrating capacitor 192 is being discharged, the voltage $V_{IN}$ across it will decrease, thereby making it more difficult for later input pulses $V_{i1}$–$V_{i5}$ to add sufficient charge to recharge input integrating capacitor 192 by increasing input voltage $V_{IN}$ above the threshold level of multi-well diode 10, and thus driving multi-well diode 10 into its high conductance state.

Each of the input coupling capacitors 172 and 174 can have different values, thus weighting their respective inputs as desired. In addition, the D.C. bias across each diode 182 or 184 can be individually set to adjust the weight or efficiency of a given size input pulse depositing charge on input integrating capacitor 192. The D.C. voltage source 176 can either be fixed at a different magnitude for each of the inputs, or $V_{DC}$ (at 176) can be fixed at the same value for all inputs and each associated biasing resistor 178 ($R_{b1}-R_{b5}$) or 180 ($R_{b6}-R_{b8}$) can have a different resistance value, thereby creating a different biasing voltage across each of the diodes 182 or 184. Electronic neuron circuit 170 can accept both excitatory and inhibitory signals. Temporal summation and integration over multiple, individually weighted inputs is possible, wherein the time constant associated with input integrating capacitor 192 determines the time period over which charge associated with multiple pulses can be integrated on input integrating capacitor 192.

As an example of synaptic weighting, $C_{i6}$ could have a value of 0.005 uF, and all of the other input capacitors 172 and 174 could have values of only 100 pF. This would give the pulse-mode input at $V_{i6}$ a substantial weighting advantage over the other inputs (both excitatory and inhibitory) and would essentially make input $V_{i6}$ fifty times more important than any of the other individual inputs of FIG. 5. The effect is that electronic neuron circuit 170 would need to receive 50 excitatory pulses at its inputs $V_{i1}-V_{i5}$ for every inhibitory pulse received of $V_{i6}$, to overcome the effect of that inhibitory, pulse which had been received at $V_{i6}$. Each of the output coupling capacitors 198 could also have a different value, thus similarly weighting each of the outputs $V_{OUT1}-V_{OUT5}$, as desired.

The circuit disclosed in FIG. 5 is analogous in operation to the biological interneuron, i.e., a neuron receiving multiple pulse-mode inputs from other neurons and distributing its output to other neurons, and can be used as a basic building block to form a neural network or a great many of such circuits. The pulse-mode inputs of the circuit of FIG. 5, all accept input pulses having amplitudes of several hundred millivolts which are integrated until a voltage large enough to overcome the threshold requirements of the multi-well diode 10 is achieved. The output pulse amplitudes of the circuit disclosed in FIG. 5, are also of the order of several hundred millivolts, as described above. Therefore, one of the outputs of the circuits disclosed in FIG. 5 (e.g., $V_{OUT1}$) can each drive the inputs of another similar circuit (e.g., $V_{i1}$). In this manner, the electronic neuron circuit 170 with multiple inputs and outputs can be used to interconnect many of such neuron circuits together, thus forming a neural network. This is very important for developing the biological equivalent of a neural network, wherein massive interconnection of hundreds or even thousands of neurons is desired.

The similarities between the electronic neuron circuit 170 of FIG. 5 and biological neurons are striking. The input integrating capacitor 192 and input resistor 193 constitute the equivalent of the body or soma of a neuron. The multiple input capacitors $C_i$, each with their rectifying diode 182 and input biasing resistor 178, correspond to the neuron's tree-like dendritic structure on which contacts (synapses) are made and signals received from other neurons. The coupling capacitor size and diode bias determine the synaptic weight analogous to the position (distance from the neuron body) and character of the synapse on the dendrite of the biological neuron. The multi-well diode 10, together with output load capacitor 194 and output load resistor 196, correspond to the neuron's trigger zone on the neuron body. The output signal line is analogous to the neuron's axon, and divides into multiple outputs which distribute the output signal in a manner analogous to that of the tree-like structure which is at the end of the biological neuron's axon. The output capacitors $C_j$ correspond to the contacts (synapses) coupling the neuron to other nearby neurons. The capacitances of the output capacitors $C_j$ also add in with output load capacitor 196 to determine the effective capacitive load.

The advantages of the above approach to the implementation of artificial neural systems are several. First, with a relatively few devices added to the essential multi-well diode 10, an electronic equivalent of the pulsed-mode operation of the biological neuron can be implemented as seen in FIGS. 3A, 4, and 5. This is in contrast to more conventional approaches based on transistors such as the silicon MOSFET, and employing standard circuit configurations. The conventional approach has typically required tens to hundreds of transistors plus additional devices, thus requiting an overly complex device.

Second, in contrast to the approach of Coon and Perera, which requires that their injection mode device operate at very low temperatures (4.2° K.), multi-well diode 10 operates at much higher temperatures, including room temperature. This facilitates the monolithic integration of multi-well diodes with conventional devices such as resistors, capacitors, diodes, and transistors. Such integration will permit the construction of systems incorporating many (perhaps hundreds or thousands) neurons and the mass fabrication of low cost systems. The sophistication of the integrated circuit fabrication technology available today can be used to achieve this. Commercially available molecular beam epitaxy (MBE) and metal-organic vapor phase epitaxial (MOVPE) systems are well suited to fabricating both the multi-well diode 10 and the above-mentioned conventional devices.

Third, due to the low voltage required, typically less than 10 volts, and the pulse mode operation of multi-well diode 10, low power operation is feasible. This is of importance when large numbers of electronic neurons must be integrated to implement an artificial neuron system.

Fourth, since the operation of the electronic neuron circuits disclosed in the present invention mimics many of the characteristics of biological neurons (such as peak height, frequency dependence, temporal summation, synaptic weighting, short-term memory, excitatory and inhibitory inputs, threshold behavior and summation over multiple inputs), it may be possible to interface the electronic neuron circuits of the present invention directly with their biological counterparts. Such interfacing between artificial and biological systems could have significant implications for studying biological systems and for prosthetic devices.

Fifth, it would be possible to implement and monolithically integrate multiple layers of electronic neurons to build more complex artificial neural systems which replicate the multi-layer structure of biological systems. For small scale systems, devices for one layer could be fabricated side by side with those of another layer using conventional integrated circuit fabrication techniques and interconnections. For large scale systems, using molecular beam epitaxy (MBE) and focusing ion beam (FIB) technology, neural device fabrication followed by a subsequent epitaxial growth in which a second layer of devices are fabricated has already been demonstrated so that three dimensional implementations of neural systems may ultimately be possible.

Alternative circuit configurations using the multi-well diode 10 can be used to replicate the functions of sensory neurons, i.e., convert external stimuli into pulse-mode electrical signals. A variety of semiconductor sensors and transducers are already available to convert physical stimuli, e.g. heat, pressure, light, etc., into electrical signals. Using these sensors, circuits using the multi-well diode 10 can be used to produce pulse-mode signals as described below.

Figure 6A:
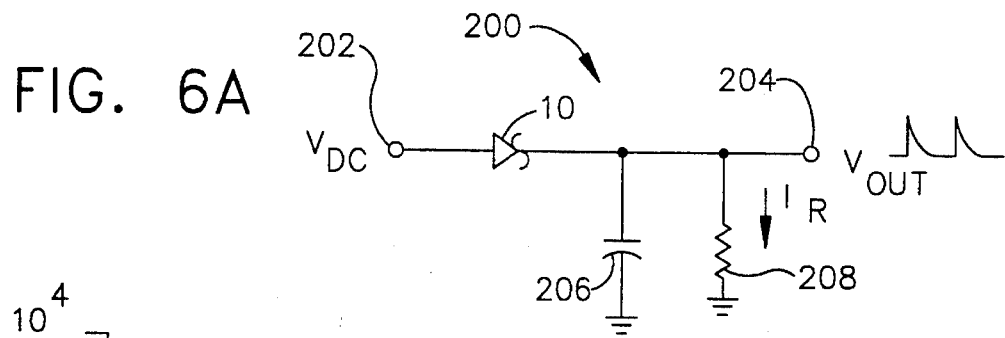
FIG. 6A is an electrical schematic diagram of an electronic neuron circuit having a DC voltage input and a pulse-mode output.

FIG. 6A depicts an electronic neuron circuit 200 having a DC input $V_{DC}$ at the location designated by the numeral 202. This circuit is relatively simple as it only has three components, the multi-well diode 10, an output load capacitor 206, and an output load resistor 208. A pulse-mode output voltage $V_{OUT}$ is produced at the location designated by the numeral 204. The operation of electronic neuron circuit 200 is as follows: when a DC bias voltage that exceeds the threshold 76 of multi-well diode 10 is applied at input 202, electronic neuron circuit 200 exhibits a pulse-mode output $V_{OUT}$, having a peak amplitude of several hundred millivolts, and having its OFF-state waveform shaped by output load capacitor 206 and output load resistor 208.

As the output voltage $V_{OUT}$ rises to its peak amplitude, the voltage drop across multi-well diode 10 tends to fall to a level that is below the holding voltage 78, which causes multi-well diode 10 to drop out of its high conductance state into its low conductance state. After multi-well diode 10 is returned to its low conductance state, then the output voltage $V_{OUT}$ decreases as capacitor 206 discharges through resistor 208, and the input voltage $V_{DC}$ can attempt to turn "on" multi-well diode 10 by causing a voltage greater than its threshold voltage 76 to develop across multi-well diode 10. When that occurs, multi-well diode 10 will "jump" into its high conductance state and produce another output pulse.

Figure 6B:
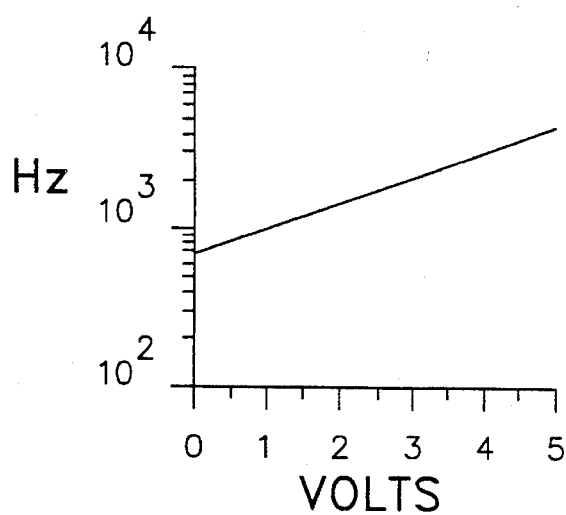
FIG. 6B is a curve showing the electrical characteristics of the output frequency versus the input voltage of the electronic neuron circuit depicted in FIG. 6A.
Figure 6C:
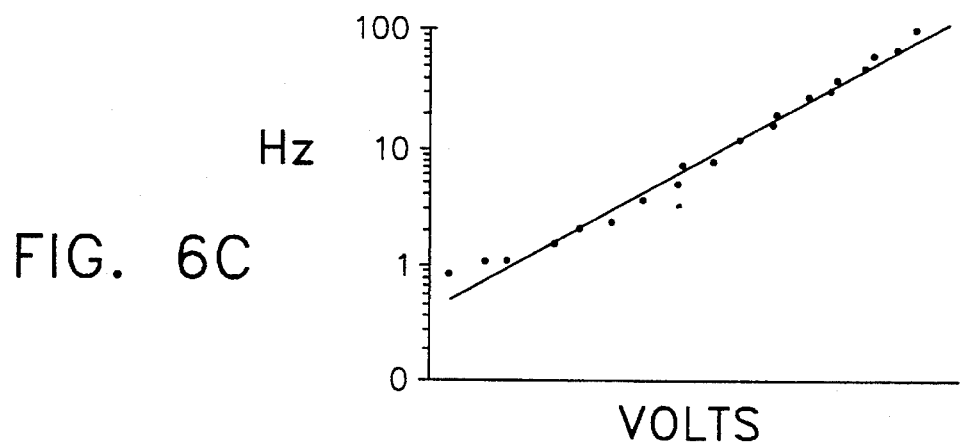
FIG. 6C is a curve depicting the electrical characteristics of the output (post synaptic current) frequency versus the input voltage (presynaptic membrane potential) of a biological neuron.

The electrical characteristics of electronic neuron circuit 200 are given in FIG. 6B, wherein the output frequency (the Y-axis) is shown to be exponentially dependent upon the input bias voltage $V_{DC}$ (the X-axis). This voltage to frequency characteristic is analogous to that of the biological neuron, having its mean membrane potential (the X-axis, in volts) versus output frequency characteristics (the Y-axis) given in FIG. 6C. As can be seen when comparing FIGS. 6B and 6C, both curves have an exponential relationship between their output frequency and their "input" voltage. It will be understood that the mean membrane potential for a given biological neuron is dependent upon the type of organism in which it exists.

Electronic neuron circuit 200 can accept a slowly varying input bias $V_{DC}$ which will produce a pulsed output $V_{OUT}$, whereas the output frequency will be slowly varying in concert with input variations. This aspect of electronic neuron circuit 200 mimics the operation of the biological sensory neuron when its input voltage is slowly graded (having a slowly changing DC amplitude at its input). It will be understood that the unusual S-type current-voltage characteristics described by FIG. 2B, are essential to the pulse-mode operation of electronic neuron circuit 200. Conventional devices cannot be used in place of multi-well diode 10 in this artificial electronic neuron.

Figure 6D:
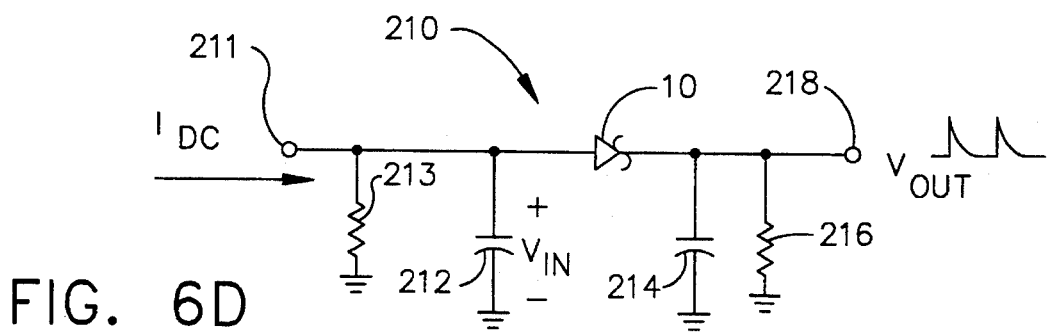
FIG. 6D is an electrical schematic diagram of an electronic neuron circuit having a direct current input and a pulse-mode output.

Similarly, a D.C. input current can be converted to a pulse-mode output signal with a corresponding frequency using a circuit generally designated by the numeral 210, depicted in FIG. 6D. In electronic neuron circuit 210, the input current $I_{DC}$, entering at the location designated by the numeral 211, is integrated on input integrating capacitor 212 until the voltage $V_{IN}$ developed across multi-well diode 10 and input integrating capacitor 212 reaches the threshold voltage 76 of multi-well diode 10. At this point, multi-well diode 10 switches to its high conductance state and electronic neuron circuit 210 produces an output pulse $V_{OUT}$ at the location designated by the numeral 218. In this case, the output pulse frequency will be a function of the input current $I_{DC}$. The pulse-mode output $V_{OUT}$, will have a peak amplitude of several hundred millivolts, and have its OFF-state waveform shaped by output load capacitor 214 and output load resistor 216.

A short-term memory resistor 213 is provided in parallel to input integrating capacitor 212, so that in situations where the input current $I_{DC}$ drops to zero, resistor 213 can slowly discharge input integrating capacitor 212. As input capacitor 212 is being discharged, the voltage $V_{IN}$ across it will decrease. This will make it more difficult for later input current $I_{DC}$ to add sufficient charge to input integrating capacitor 212 to increase the input voltage $V_{IN}$ above the threshold level 76 of multi-well diode 10, thereby driving multi-well diode 10 into its high conductance state. Electronic neuron circuit 210 can accept a slowly varying input current $I_{DC}$ which will produce a pulsed output, wherein the output frequency will be slowly varying in concert with input variations.

Figure 7:
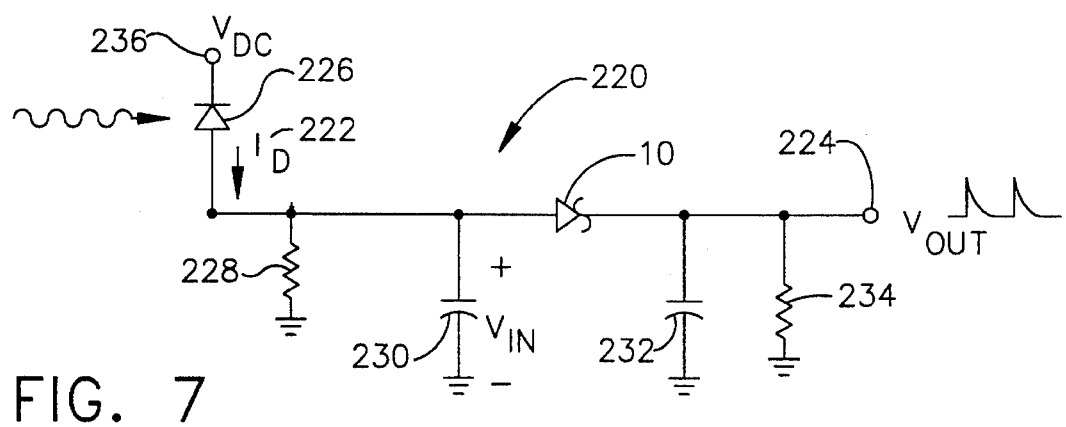
FIG. 7 is an electrical schematic diagram of an electronic neuron circuit having an optical input and a pulse-mode output.

In addition to the multi-well diode's uses in purely electronic systems, use of optoelectronic components at either the input or the output could also be achieved. FIG. 7 discloses an electronic neuron circuit 220 having an optical input. A photodiode 226 is used to generate an input current 222 ($I_D$), thereby supplying current to charge input integrating capacitor 230, thus producing a voltage $V_{IN}$. The input circuit also includes a DC voltage source 236 and an input resistor 228. A multi-well diode 10 can have its high conductance state triggered when the input bias voltage $V_{IN}$ exceeds the threshold 76 of multi-well diode 10.

When switched into its high conductance state, multi-well diode 10 produces an output voltage pulse $V_{OUT}$ at the location designated by the numeral 224, and this output pulse has its off-state waveform shaped by the output load capacitor 232 and the output load resistor 234.

Electronic neuron circuit 220 can, thus, convert an incoming optical signal into a photocurrent ($I_D$) that can be integrated on input integrating capacitor 230. Multi-well diode 10 can be used to implement an "optoelectronic neuron" for which the frequency of output pulses is proportional to the intensity of the received light (at photodiode 226). This is an attractive feature for use with optical pattern recognition, e.g., for identifying an image in a photograph, where the information to be analyzed is already in optical form.

Electronic neuron circuit 220 can also receive pulses of optical energy at photodiode 226 and use such input pulses to operate in a like manner as excitatory pulse-mode input circuit 100. In this circumstance, photodiode 226 converts each received optical pulse (photons) into a photocurrent pulse $I_D$. Each pulse of photocurrent $I_D$ tends to charge input integrating capacitor 230, thus increasing the input voltage $V_{IN}$ toward the point where $V_{IN}$ exceeds the threshold voltage 76 of multi-well diode 10. Once the threshold voltage 76 is exceeded, multi-well diode 10 is driven into its high conductance state, thereby producing an output pulse-mode signal $V_{OUT}$.

Resistor 228 can act as a short-term memory resistor as it is located in parallel to input integrating capacitor 230. In situations where one or more optically generated input pulses $I_D$ are received by electronic neuron circuit 220 which are not sufficient to cause multi-well diode 10 to be driven into its high-conductance state, and if thereafter no more input pulses $I_D$ are received for a predetermined time period, then resistor 228 can slowly discharge input integrating capacitor 230. As input integrating capacitor 230 is being discharged, the voltage $V_{IN}$ across it will decrease, thereby making it more difficult for later input pulses $I_D$ to add sufficient charge to recharge input integrating capacitor 230 by increasing input voltage $V_{IN}$ above the threshold level of multi-well diode 10, and thus driving multi-well diode 10 into its high conductance state.

The overall system characteristics of electronic neuron circuit 220 are very similar to the electronic neuron circuit 210 having a DC current input, which is described above and is depicted in FIG. 6D. It will be understood that other types of optoelectronic devices could be used to convert optical signals into electrical signals, such as photovoltaic cells, photoconductive devices, and phototransistors.

Figure 8:
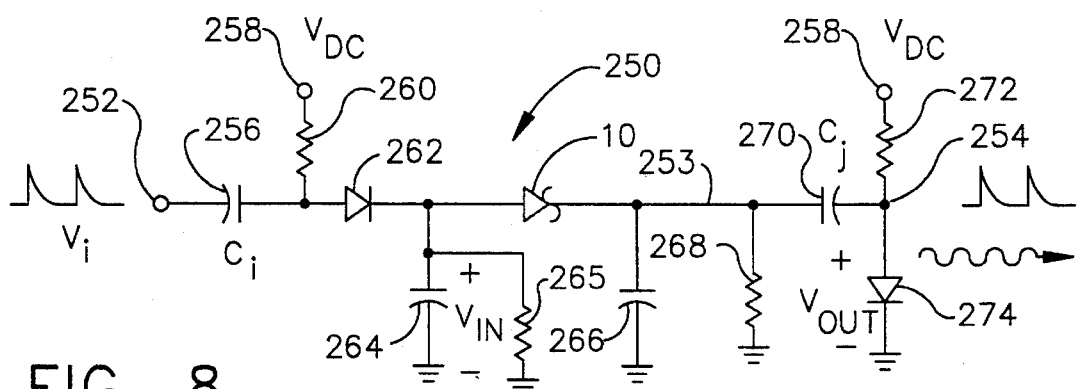
FIG. 8 is an electrical schematic diagram of an electronic neuron circuit having a pulse-mode input and an optical output.

An electronic neuron circuit 250 having an optical output is depicted in FIG. 8. Electronic neuron circuit 250 uses a pulse-mode electrical input $V_i$ which creates a pulse-mode electrical output $V_{OUT}$ that modulates the intensity of a miniature semiconductor laser or LED, thus producing a pulsed optical output. Since the same compound semiconductor materials employed in the fabrication of miniature semiconductor lasers and photodiodes are also used in multi-well diode 10, integration of optical devices with artificial electronic neural systems is possible.

Electronic neuron circuit 250 operates as follows: a pulse-mode input $V_i$ is received at the location designated by the numeral 252. This input pulse voltage crosses input coupling capacitor 256 ($C_i$) (which can be weighted), and then travels through rectifying diode 262. The combination of a DC voltage source 258, input biasing resistor 260, and rectifying diode 262 rectifies all received pulses and tends to charge the input integrating capacitor 264, thus producing a voltage $V_{IN}$. When $V_{IN}$ exceeds the threshold voltage 76 of multi-well diode 10, an output pulse is generated by multi-well diode 10, thus producing a voltage output pulse at the location designated by the numeral 253 which has its off-state waveform determined by output load capacitor 266 and output load resistor 268.

It will be understood that multiple excitatory as well as inhibitory inputs can be used at the input of electronic neuron circuit 250 similar to that for electronic neuron circuit 170, seen in FIG. 5. It will also be understood that multiple optical outputs for electronic neuron circuit 250 are also possible which are analogous to the multiple electrical outputs for electronic neuron circuit 170 in FIG. 5. To achieve multiple optical outputs, for each output capacitor 270 ($C_{j1}$–$C_{j5}$), a D.C. voltage source 258, bias resistor 272, and semiconductor laser diode or LED 274 is needed, configured as in electronic neuron circuit 250 depicted in FIG. 8.

A short-term memory resistor 265 is provided in parallel to input integrating capacitor 264, so that in situations where one or more input pulses $V_i$ are received by electronic neuron circuit 250 which are not sufficient to cause multi-well diode 10 to be driven into its high-conductance state, and if thereafter no more input pulses $V_i$ are received for a predetermined time period, then resistor 265 can slowly discharge input integrating capacitor 264. As input integrating capacitor 264 is being discharged, the voltage $V_{IN}$ across it will decrease, thereby making it more difficult for later input pulses $V_i$ to add sufficient charge to recharge input integrating capacitor 264 by increasing input voltage $V_{IN}$ above the threshold level of multi-well diode 10, and thus driving multi-well diode 10 into its high conductance state.

The output pulse voltage crosses output coupling capacitor 270 ($C_j$), thus producing a voltage pulse $V_{OUT}$ (at the location designated by the numeral 254) across an LED or laser diode 274. The LED or laser diode 274 is biased by DC voltage source 258 and output biasing resistor 272. When sufficient voltage $V_{OUT}$ exists across the LED or laser diode 274, then enough forward current will be produced through that diode to produce an optical output from that diode 274. Biasing resistor 272 is chosen such that LED 274 is biased near its "turn-on" or threshold voltage, but remains in its "OFF-state" until an additional voltage pulse $V_{OUT}$ occurs.

It will be understood that other optoelectronic devices that can create optical signals from electrical signals, including those which do not yet exist, can be used in lieu of the LED or laser diode 274 depicted above.

One advantage to electronic neuron circuit 250 is that its output, being optical in character, is electrically isolated from whatever device that will be receiving that optical signal. The electronic neuron circuit 220 having an optical input could be combined with the optical output of electronic neuron circuit 250, thereby producing a combination electronic neuron circuit 280 which is completely electrically isolated from any other electrical components. Such a circuit would have both an optical input and an optical output, however, it would still operate as an electronic neuron.

Figure 9:
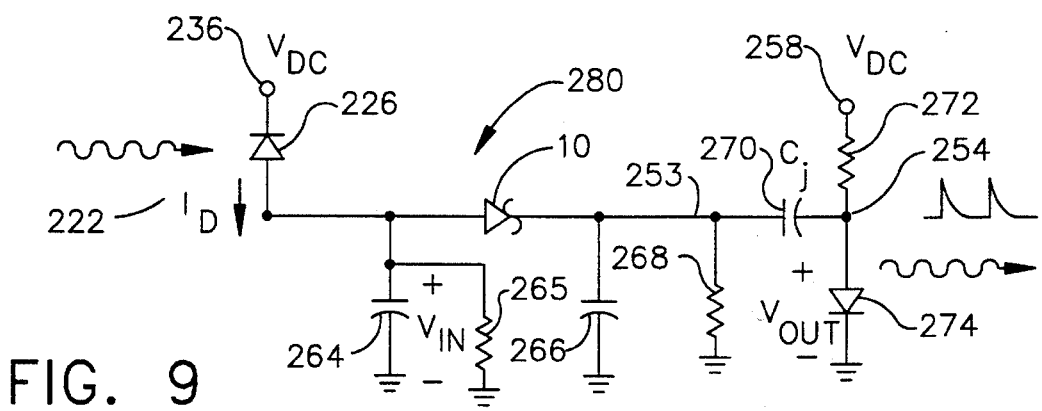
FIG. 9 is an electrical schematic diagram of an electronic neuron circuit having an optical input and an optical output.

A circuit diagram of a preferred combination electronic neuron circuit 280 is given in FIG. 9, in which both the input signal and the output signal are optical in nature. A photodiode 226 is used to generate an input current 222 ($I_D$), thereby supplying current to charge input integrating capacitor 264, thus producing a voltage $V_{IN}$. The input circuit also includes a DC voltage source 236.

Electronic neuron circuit 280 operates as follows: a pulse-mode input of optical energy is received by photodiode 226, thereby creating a current pulse $I_D$ at the location designated by the numeral 222. This input pulse current tends to charge the input integrating capacitor 264, thus producing a voltage $V_{IN}$. When $V_{IN}$ exceeds the threshold voltage 76 of multi-well diode 10, an output pulse is generated by multi-well diode 10, thus producing a voltage output pulse $V_{OUT}$ at the location designated by the numeral 254. This voltage pulse applied to laser diode or LED 274 turns on the laser diode or LED 274, briefly producing an optical pulse. The decay portion of the output voltage pulse $V_{OUT}$ is in part determined by output load capacitor 266 and output load resistor 268. Similarly, a continuous-mode optical input signal could be accepted by photodiode 226 in electronic circuit 280, producing a photocurrent $I_D$ which would be integrated on input integrating capacitor 264, thereby producing a pulsed optical output.

A short-term memory resistor 265 is provided in parallel to input integrating capacitor 264 which acts in the same manner as described above with regard to electronic neuron circuit 250, depicted in FIG. 8.

The output pulse voltage crosses output coupling capacitor 270 ($C_j$), thus producing a voltage $V_{OU_t}$ across an LED or laser diode 274. The LED or laser diode 274 is biased by DC voltage source 258 and output biasing resistor 272. When sufficient voltage $V_{OUT}$ exists across the LED or laser diode 274, then enough forward current will be produced through that diode to produce an optical output from that diode 274. Biasing resistor 272 is chosen such that LED 274 is biased near its "turn-on" or threshold voltage, but remains in its "OFF-state" until an additional voltage pulse $V_{OUT}$ occurs.

The advantages of such a circuit 280 are numerous, including the fact that, because optical signal transmissions are less susceptible to electromagnetic noise interference, this circuit would reduce noise levels and allow operation in noisier environments. In addition, this circuit could interface directly with optical fibers for transmission and reception of signals.

A further advantage of optical input/output circuit 280 is that by using the photodiode 226 as an optical detector at the front end of circuit 280, multiple optical beams could be focused on photodiode 226 so that, with one device (photodiode 226), several inputs could be fed into a given electronic neuron circuit 280.

Similarly, using multiple output coupling capacitors 270 ($C_j$), such as seen on the output of electronic neuron circuit 170 in FIG. 5 ($C_{j1}$–$C_{j5}$), each connected to drive an optical output as in electronic neuron circuit 280, an individual electronic neuron could distribute its output signal optically using multiple laser diodes or LEDs 274. Each laser diode or LED 274 would require a biasing voltage source 258 ($V_{DC}$) and a biasing resistor 272, in addition to the coupling capacitor 270 ($C_j$). Alternatively, optical pulses, once generated by the laser diode or LED 274, could be optically divided and separated, i.e., by use of beam splitting, to distribute the optical signal.

Figure 10:
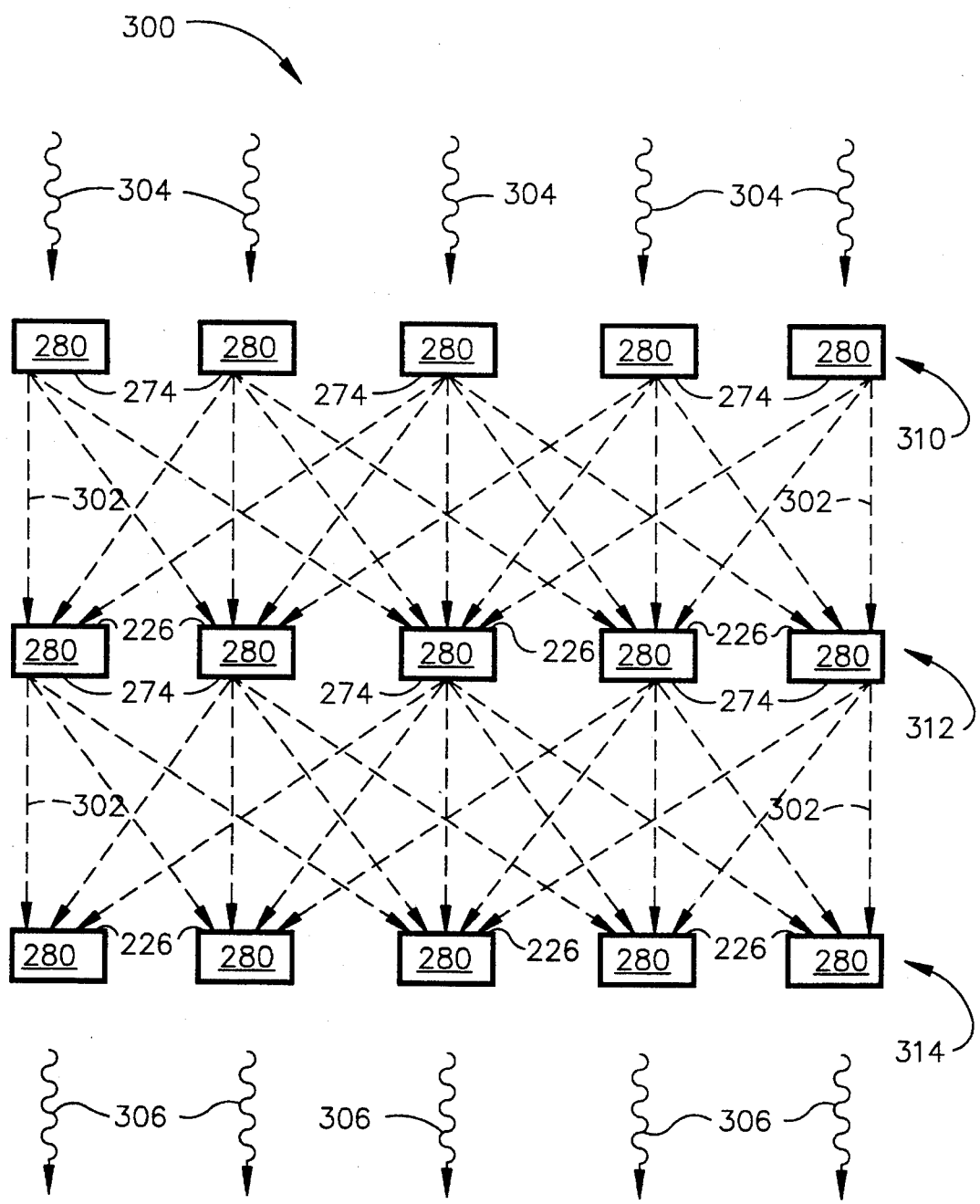
FIG. 10 is a diagrammatic view of an array of electronic neuron circuits each having multiple optical inputs and multiple optical outputs.

The use of multiple optical input signals per photodiode 226 and multiple optical outputs (using a laser diode or LED 274) can be broadened into an array 300 of optical input/output circuits 280, each of which can receive optical input signals from several different sources, and distribute its optical output to several other neurons 280. Such an array is depicted in FIG. 10, in which each circuit 280 preferably has an optical input which can receive multiple optical signals, and several optical outputs which can transmit multiple optical signals. The top row 310 of the array 300 includes several optical input/output circuits 280, each of which can receive an optical signal 304 as part of an optical image, and which can send output optical signals from their individual laser diodes or LEDs 274 aimed at more than one target. The light paths of such output optical signals are designated by the numeral 302.

The middle row 312 of array 300 includes several optical input/output circuits 280, each of which can receive input optical signals at their individual photodiodes 226 from more than one light source in row 310 (coming from more than one direction—more than one path 302), and can send output optical signals from their individual laser diodes 274, each aimed at more than one target (photodiodes) in row 314. Again, the light paths of such output optical signals are designated by the numeral 302.

Continuing in a like manner, the bottom row 314 of array 300 includes several optical input/output circuits 280, each of which can receive input optical signals at their individual photodiodes 226 from more than one light source in row 312 (coming from more than one direction—more than one path 302). Each of the input/output circuits 280 in row 314 can transmit optical signals 306 to other external devices, via fiber optic cable .or other transmission medium.

The circuit of array 300 operates on the principle that crossing optical beams do not interfere with one another. Therefore, the outputs of devices in one array (top row 310) can be distributed to a second array of devices (middle row 312), which eases the interconnection problem. In a like manner, the outputs of devices in a second array (middle row 312) can be distributed to a third array of devices (bottom row 314). This concept can be further extended from rows of devices to two dimensional arrays of lasers and detectors, and to vertical stacking of multiple sets of such optical source-detector combinations 280.

The foregoing description of a preferred embodiment of the invention has been presented for purposes of illustration and description. It is not intended to be exhaustive or to limit the invention to the precise form disclosed. Obvious modifications or variations are possible in light of the above teachings. The embodiment was chosen and described in order to best illustrate the principles of the invention and its practical application to thereby enable one of ordinary skill in the art to best utilize the invention in various embodiments and with various modifications as are suited to the particular use contemplated. It is intended that the scope of the invention be defined by the claims appended hereto.

We claim:

1. An electronic neuron circuit, comprising:
   (a) a multi-well diode having an anode, cathode, and i-region, said i-region comprising at least one deep well and at least two barriers, said at least one deep well exhibiting a narrower energy band gap than the energy band gap of said barriers, said multi-well diode having a low conductance state and a high conductance state, each of which are stable operating regions at a forward bias voltage, said multi-well diode also having a threshold voltage which the bias voltage applied to said multi-well diode must exceed to switch from the low conductance state into the high conductance state, said multi-well diode also having a holding condition which the bias voltage and current must fall below to switch from the high conductance state into the low conductance state;
   (b) an input circuit for producing a voltage which creates a forward bias of said multi-well diode as the multi-well diode remains in its low conductance state;
   (c) an interface circuit detecting an input signal and for reacting to the magnitude or frequency of said input signal, said multi-well diode, as its threshold voltage is exceeded by a voltage produced by said input circuit, switching through an unstable operating region into a stable high conductance state, and said multi-well diode, as said input circuit produces a voltage and current which falls below the holding condition, switching from its stable high conductance state into its stable low conductance state; and
   (d) an output circuit for generating an output pulse-mode signal based upon the magnitude or frequency of said input signal, the frequency of said output pulse-mode signal being related to the frequency or magnitude of said input signal.

2. An electronic neuron circuit as recited in claim 1, wherein:
   (a) said interface circuit is compatible with at least one pulse-mode input signal; and
   (b) said output circuit generates a pulse-mode signal which is related to the frequency of said at least one pulse-mode input signal, and the frequency and magnitude of said output pulse-mode signal are generally different than the frequency and magnitude of said at least one pulse-mode input signal.

3. An electronic neuron circuit as recited in claim 2, wherein a plurality of pulse-mode inputs are detected by said interface circuit, and wherein each of the plurality of pulse-mode inputs are weighted wherein one of the pulse-mode inputs has a greater effect in causing said input circuit to drive said multi-well diode into switching into its stable high conductance state, than do other of the pulse-mode inputs.

4. An electronic neuron circuit as recited in claim 1, wherein:
   (a) said interface circuit is compatible with at least one pulse-mode input signal; and
   (b) said interface circuit is configured such that each pulse-mode input signal received has the effect of partially inhibiting said input circuit from driving said multi-well diode into switching into its stable high conductance state.

5. An electronic neuron circuit as recited in claim 4, wherein a plurality of pulse-mode inputs are detected by said interface circuit, and each of said plurality of pulse-mode inputs is weighted, and wherein one of the pulse-mode inputs has a greater effect in inhibiting said input circuit from driving said multi-well diode into switching into its stable high conductance state, than do other of the plurality of pulse-mode inputs.

6. An electronic neuron circuit as recited in claim 1, wherein:
  (a) said interface circuit is configured to be compatible with pulse-mode inputs of two types, an excitatory pulse-mode input signal and an inhibitory pulse-mode input signal;
  (b) said output circuit generates a pulse-mode signal which is related to the frequency of said excitatory pulse-mode input signal, wherein the frequency and magnitude of said output pulse-mode signal can be different than the frequency and magnitude of said excitatory pulse-mode input signal;
  (c) said interface circuit configured such that each inhibitory pulse-mode input signal received has the effect of partially inhibiting said input circuit from driving said multi-well diode into switching into its stable high conductance state; and
  (d) said interface circuit in conjunction with said input circuit cannot switch said multi-well diode into a high conductance state until the cumulative weight of received excitatory pulse-mode input signals produces a forward voltage applied to said multi-well diode that exceeds the cumulative weight of received inhibitory pulse-mode input signals by at least the threshold voltage of said multi-well diode.

7. An electronic neuron circuit as recited in claim 1, wherein said output pulse-mode signal is connected to a plurality of external electrical devices.

8. An electronic neuron circuit as recited in claim 7, wherein each connection to said plurality of external electrical devices can be weighted, wherein one of the pulse-mode output signal connections has a greater effect at its external electrical device than other of the pulse-mode output signal connections.

9. An electronic neuron circuit as recited in claim 1, wherein said interface circuit is compatible with at least one optical input signal.

10. An electronic neuron circuit as recited in claim 1, wherein said interface circuit is compatible with at least one optical input signal which is continuous in magnitude.

11. An electronic neuron circuit as recited in claim 2, wherein said interface circuit is compatible with at least one pulse-mode optical input signal.

12. An electronic neuron circuit as recited in claim 4, wherein said interface circuit is compatible with at least one optical input signal.

13. An electronic neuron circuit as recited in claim 6, wherein said interface circuit is compatible with at least one optical input signal.

14. An electronic neuron circuit as recited in claim 1, wherein said output circuit is compatible with at least one optical output signal.

15. An electronic neuron circuit as recited in claim 4, wherein said output circuit is compatible with at least one optical output signal.

16. An electronic neuron circuit as recited in claim 6, wherein said output circuit is compatible with at least one optical output signal.

17. An electronic neuron circuit as recited in claim 9, further comprising an output circuit that generates a pulse-mode signal which is compatible with at least one optical output signal.

18. An electronic neuron circuit as recited in claim 10, further comprising an output circuit that generates a pulse-mode signal which is compatible with at least one optical output signal.

19. An electronic neuron circuit as recited in claim 11, further comprising an output circuit that generates a pulse-mode signal which is compatible with at least one optical output signal.

20. An electronic neuron circuit as recited in claim 12, further comprising an output circuit that generates a pulse-mode signal which is compatible with at least one optical output signal.

21. An electronic neuron circuit as recited in claim 13, further comprising an output circuit that generates a pulse-mode signal which is compatible with at least one optical output signal.

22. A plurality of electronic neuron circuits as recited in claim 17, wherein each input of said electronic neuron circuit senses more than one optical input signal and from more than one direction.

23. A plurality of electronic neuron circuits as recited in claim 17, further comprising:
  (a) an array of like electronic neuron circuits that each have inputs which are compatible with at least one optical input signal and outputs which are compatible with at least one optical output signal, wherein;
    (i) the input of each of said electronic neuron circuits senses more than one optical input signal and from more than one direction;
    (ii) the output of each of said electronic neuron circuits directs its optical output signal in more than one direction;
    (iii) each of said at least one optical input and output signal has a path which travels from the output of one of said electronic neuron circuits to the input of another of said electronic neuron circuits, and optical signals following two separate paths do not interfere with one another at locations where one of the separate paths intersects with the other of the separate paths; and
    (iv) the input of each of said electronic neuron circuits responds to the cumulative effect of all input signals received from any of said optical signal paths, and said cumulative effect of all input signals received tends to cause an output pulse to be generated at said optical output.

24. A plurality of electronic neuron circuits as recited in claim 17, further comprising:
  (a) an array of like electronic neuron circuits that each have pulse-mode inputs, both excitatory and inhibitory, which are compatible with at least one optical input signal and outputs which are compatible with at least one optical output signal, wherein;
    (i) the pulse-mode input of each of said electronic neuron circuits senses more than one optical input signal and from more than one direction;
    (ii) the output of each of said electronic neuron circuits directs its optical output signal in more than one direction;
    (iii) each of said at least one optical input and output signal has a path which travels from the output of one of said electronic neuron circuits to the input of another of said electronic neuron circuits, and optical signals following two separate paths do not interfere with one another at locations where one of the separate paths intersects with the other of the separate paths; and (iv) the pulse-mode input of each of said electronic neuron circuits responds to each input pulse received from any of said optical signal paths, and each input pulse received tends either to inhibit an output pulse from being generated, or to cause an output pulse to be generated at said optical output.

25. An electronic neuron circuit as recited in claim 1, wherein:

(a) said interface circuit is compatible with at least one direct current-mode input signal; and (b) said output circuit generates a pulse-mode signal which is related to the magnitude of said at least one direct current-mode input signal.

* * * * *